(12) United States Patent
Defferriere et al.

(10) Patent No.: US 10,910,559 B2
(45) Date of Patent: Feb. 2, 2021

(54) OPTOELECTRONIC MEMRISTOR DEVICES INCLUDING ONE OR MORE SOLID ELECTROLYTES WITH ELECTRICALLY CONTROLLABLE OPTICAL PROPERTIES

(71) Applicant: Massachusetts Institute of Technology, Cambridge, MA (US)

(72) Inventors: Thomas Defferriere, Cambridge, MA (US); Dmitri Kalaev, Waltham, MA (US); Harry L. Tuller, Wellesley, MA (US); Jennifer Lilia Rupp, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/427,597

(22) Filed: May 31, 2019

(65) Prior Publication Data

US 2020/0028074 A1  Jan. 23, 2020

Related U.S. Application Data

(60) Provisional application No. 62/679,322, filed on Jun. 1, 2018.

(51) Int. Cl.
*G11C 13/00* (2006.01)
*G11C 13/04* (2006.01)
*H01L 45/00* (2006.01)

(52) U.S. Cl.
CPC ...... *H01L 45/1213* (2013.01); *G11C 13/0009* (2013.01); *G11C 13/048* (2013.01); *H01L 45/08* (2013.01); *H01L 45/1253* (2013.01)

(58) Field of Classification Search
CPC . H01L 45/1213; H01L 45/08; H01L 45/1253; G11C 13/0009; G11C 13/048
(Continued)

(56) References Cited

U.S. PATENT DOCUMENTS 5,793,520 A   8/1998  Stace et al.
5,970,187 A   10/1999 Notten et al.
(Continued)

OTHER PUBLICATIONS

Avgerinou et al., "Trends in data centre energy consumption under the european code of conduct for data centre energy efficiency." Energies 10.10 (2017): 1470. 18 pages.
(Continued)

*Primary Examiner* — Sung Il Cho
(74) *Attorney, Agent, or Firm* — Smith Baluch LLP

(57) ABSTRACT

An optoelectronic memristor includes a first electrode, a second electrode, and a solid electrolyte in between that is in electrical communication with the first electrode and the second electrode. The solid electrolyte has an electronic conductivity of about $10^{-10}$ Siemens/cm to about $10^{-4}$ Siemens/cm at room temperature. The first electrode, and optionally the second electrode, can be optically transparent at a specific wavelength and/or a wavelength range. A direct current (DC) voltage source is employed to apply an electric field across the solid electrolyte, which induces a spatial redistribution of ionic defects in the solid electrolyte. In turn, this causes a change in electrical resistance of the solid electrolyte. The application of the electric field can also cause a change in an optical property of the solid electrolyte at the specific wavelength, and/or at the wavelength range (or a portion thereof).

29 Claims, 21 Drawing Sheets

(58) Field of Classification Search
USPC .......................................................... 365/106
See application file for complete search history.

(56) References Cited

U.S. PATENT DOCUMENTS

| | | | |
|---|---|---|---|
| 2005/0156609 | A1 | 7/2005 | Pfaff et al. |
| 2013/0037773 | A1 | 2/2013 | Strukov et al. |
| 2013/0234098 | A1* | 9/2013 | Rothschild ......... G11C 13/0004 257/4 |
| 2015/0083987 | A1 | 3/2015 | Kakushima et al. |
| 2017/0140821 | A1* | 5/2017 | Mazed ................. G11C 13/047 |
| 2017/0161417 | A1* | 6/2017 | Sorger .................. G06F 30/367 |
| 2017/0294678 | A1* | 10/2017 | Lee ......................... H01M 4/62 |
| 2018/0113330 | A1* | 4/2018 | Maguire-Boyle ....... G02F 1/091 |
| 2019/0294021 | A1* | 9/2019 | Abel ....................... G06N 3/067 |

OTHER PUBLICATIONS

Bishop et al., "Mechanical, electrical, and optical properties of (Pr, Ce) O2 solid solutions: kinetic studies." ECS Transactions 35.1 (2011): 1137-1144.

Brunauer et al., "UV-Light-Driven Oxygen Pumping in a High-Temperature Solid Oxide Photoelectrochemical Cell." Advanced Functional Materials 26.1 (2016): 120-128.

Burr et al., "Overview of candidate device technologies for storage-class memory", IBM Journal of Research and Development, vol. 52 No. 4/5, pp. 449-464, Jul./Sep. 2008. 21 pages.

Chen et al., "Praseodymium-cerium oxide thin film cathodes: Study of oxygen reduction reaction kinetics." Journal of electroceramics 28.1 (2012): 62-69.

Demiryont et al., "Effects of oxygen content on the optical properties of tantalum oxide films deposited by ion-beam sputtering." Applied Optics 24.4 (1985): 490-495.

Gaillardon et al., Disruptive Logic Architectures and Technologies: From Device to System Level. Springer Science & Business Media, 2012. 192 pages.

Guo, "Roles of Schottky barrier and oxygen vacancies in the electroforming of SrTiO3." Applied Physics Letters 101.15 (2012): 152903.

Hoessbacher et al., "The plasmonic memristor: a latching optical switch." Optica 1.4 (2014): 198-202.

Hudec et al., "Interface engineered HfO2-based 3D vertical ReRAM." Journal of Physics D: Applied Physics 49.21 (2016): 215102. 10 pages.

Index et al., Cisco Visual Networking Index: Forecast and Methodology, 2016-2021. Cisco Public Jun. 6, 2017. pp. 2016-2021.

Integrated Photonic Systems Roadmap A. I. M. Photonics, "2016 Roadmap," no. Dec. 2016. 34 pages.

International Search Report and Written Opinion in International Patent Application No. PCT/US2019/034806 dated Sep. 3, 2019, 15 pages.

International Technology Roadmap for Semiconductor Industry (ITRS) 2012 Edition. 162 pages.

Ismail et al., "Forming-free bipolar resistive switching in nonstoichiometric ceria films." Nanoscale research letters 9.1 (2014): 45. 8 pages.

J. J. Kim, Interactive and Interpretable Machine Learning Models for Human Machine Collaboration. MIT thesis, Jun. 2015. 143 pages.

Jo et al., "Nanoscale memristor device as synapse in neuromorphic systems." Nano letters 10.4 (2010): 1297-1301.

Joushaghani et al., "Wavelength-size hybrid Si—VO 2 waveguide electroabsorption optical switches and photodetectors." Optics express 23.3 (2015): 3657-3668.

Kalaev et al., "Examining the crossing of I—V curves in devices based on mixed-ionic-electronic-conductors." Solid State Ionics 262 (2014): 883-888.

Kalaev et al., "Negative differential resistance and hysteresis in Au/MoO3-δ/Au devices." RSC Advances 7.60 (2017): 38059-38068.

Kalaev et al., "On conditions leading to crossing of I—V curve in metal1| mixed-ionic-electronic-conductor| metal2 devices." Solid State Ionics 241 (2013): 17-24.

Kalaev et al., "Rectification in solid state devices under odd conditions due to motion of ionic defects." Solid State Ionics 212 (2012): 26-42.

Kim et al., "Investigation of nonstoichiometry in oxide thin films by simultaneous in situ optical absorption and chemical capacitance measurements: Pr-doped ceria, a case study." Chemistry of Materials 26.3 (2014): 1374-1379.

Kim et al., "Large tunable photoeffect on ion conduction in halide perovskites and implications for photodecomposition." Nature materials 17.5 (2018): 445. 6 pages.

Kim et al., "Nanoscale resistive memory with intrinsic diode characteristics and long endurance." Applied Physics Letters 96.5 (2010): 053106: 5-8.

Kim et al., "One Transistor—One Resistor Devices for Polymer Non-Volatile Memory Applications." Advanced Materials 21.24 (2009): 2497-2500.

Kim et al., "Optically derived energy band gap states of Pr in ceria." Solid State Ionics 225 (2012): 198-200.

Kimerling, "Recombination enhanced defect reactions." Solid-State Electronics 21.11-12 (1978): 1391-1401.

Koch et al., "Optical memristive switches." Journal of Electroceramics 39.1-4 (2017): 239-250.

Kubicek et al., "Uncovering two competing switching mechanisms for epitaxial and ultrathin strontium titanate-based resistive switching bits." ACS nano 9.11 (2015): 10737-10748.

Laidani et al., "Intrinsic defects and their influence on the chemical and optical properties of TiO2-x films." Journal of Physics D: Applied Physics 43.48 (2010): 485402. 12 pages.

Lee et al., "A fast, high-endurance and scalable non-volatile memory device made from asymmetric Ta 2 O 5—x/TaO 2-x bilayer structures." Nature materials 10.8 (2011): 625-630.

Lee et al., "High current density and nonlinearity combination of selection device based on TaO x/TiO2/TaO x structure for one selector—one resistor arrays." ACS nano 6.9 (2012): 8166-8172. 7 pages.

Lee et al., "Novel Electroforming-Free Nanoscaffold Memristor with Very High Uniformity, Tunability, and Density." Advanced materials 26.36 (2014): 6284-6289.

Li et al., "Visible-light-accelerated oxygen vacancy migration in strontium titanate." Scientific reports 5 (2015): 14576. 7 pages.

Linn et al., "Complementary resistive switches for passive nanocrossbar memories." Nature materials 9.5 (2010): 403-406.

Mazumder et al., "Memristors: devices, models, and applications." Proceedings of the IEEE 100.6 (2012): 1911-1919.

Messerschmitt et al., "How does moisture affect the physical property of memristance for anionic-electronic resistive switching memories?." Advanced Functional Materials 25.32 (2015): 5117-5125.

Messerschmitt et al., "Memristor kinetics and diffusion characteristics for mixed anionic-electronic SrTiO3-δ bits: the memristor-based cottrell analysis connecting material to device performance." Advanced Functional Materials 24.47 (2014): 7448-7460.

Muenstermann et al., "Coexistence of filamentary and homogeneous resistive switching in Fe-doped SrTiO3 thin-film memristive devices." Advanced materials 22.43 (2010): 4819-4822.

Pan et al., "Recent progress in resistive random access memories: materials, switching mechanisms, and performance." Materials Science and Engineering: R: Reports 83 (2014): 1-59.

Pershin et al., "Memory effects in complex materials and nanoscale systems." Advances in Physics 60.2 (2011): 145-227.

Pleros et al., Optical Interconnect and Memory Technologies for Next Generation Computing. 2016 IEEE Photonics Conference (IPC), Waikoloa, HI, USA, vol. 1, 2016, pp. 121-122.

Rao, "Mixed Valence in Chemistry." Theoretical and Experimental Aspects of Valence Fluctuations and Heavy Fermions. Springer, Boston, MA, 1987. 235-242.

(56) References Cited

OTHER PUBLICATIONS

Riseborough et al., "Mixed valent metals." Reports on Progress in Physics 79.8 (2016): 084501. 46 pages.

Schindler et al., "Low current resistive switching in Cu—Si O 2 cells." Applied Physics Letters 92.12 (2008): 122910. 4 pages.

Schmitt et al., "Design of oxygen vacancy configuration for memristive systems." ACS nano 11.9 (2017): 8881-8891.

Schweiger et al., "A microdot multilayer oxide device: let us tune the strain-ionic transport interaction." ACS nano 8.5 (2014): 5032-5048.

Stefanik et al., "Nonstoichiometry and defect chemistry in praseodymium-cerium oxide." Journal of electroceramics 13.1-3 (2004): 799-803.

Strachan et al., "Characterization of electroforming-free titanium dioxide memristors." Beilstein journal of nanotechnology 4.1 (2013): 467-473.

Strukov et al., "The missing memristor found." nature 453.7191 (2008): 80-83.

Szot et al., "Switching the electrical resistance of individual dislocations in single-crystalline SrTiO 3." Nature materials 5.4 (2006): 312-320.

Wang et al., "Improving the electrical performance of resistive switching memory using doping technology." Chinese Science Bulletin 57.11 (2012): 1235-1240.

Wang et al., "Memristors with diffusive dynamics as synaptic emulators for neuromorphic computing." Nature materials 16.1 (2017): 101-108.

Wang et al., "Elimination of forming process for TiOx nonvolatile memory devices." IEEE Electron Device Letters 30.7 (2009): 763-765.

Wong et al, Stanford Memory Trends. Stanford Nanoelectronics Lab Dec. 17, 2018. Accessed at https://nano.stanford.edu/stanford-memory-trends, 4 pages.

Wouters et al., "Phase-change and redox-based resistive switching memories." Proceedings of the IEEE 103.8 (2015): 1274-1288.

Yang et al., "Memristive switching mechanism for metal/oxide/metal nanodevices." Nature nanotechnology 3.7 (2008): 429-433.

Yang et al., "Organic electronics: Battery-like artificial synapses." Nature materials 16.4 (2017): 396-397.

Yang et al., "Resolving voltage—time dilemma using an atomic-scale lever of subpicosecond electron-phonon interaction." Nano letters 14.9 (2014): 5058-5067.

Younis et al., "Probing complementary memristive characteristics in oxide based memory device via non-conventional chronoamperometry approach." Applied Physics Letters 108.3 (2016): 033506. 6 pages.

Zhao et al., "Quantification of light-enhanced ionic transport in lead iodide perovskite thin films and its solar cell applications." Light: Science & Applications 6.5 (2017): e16243. 8 pages.

\* cited by examiner

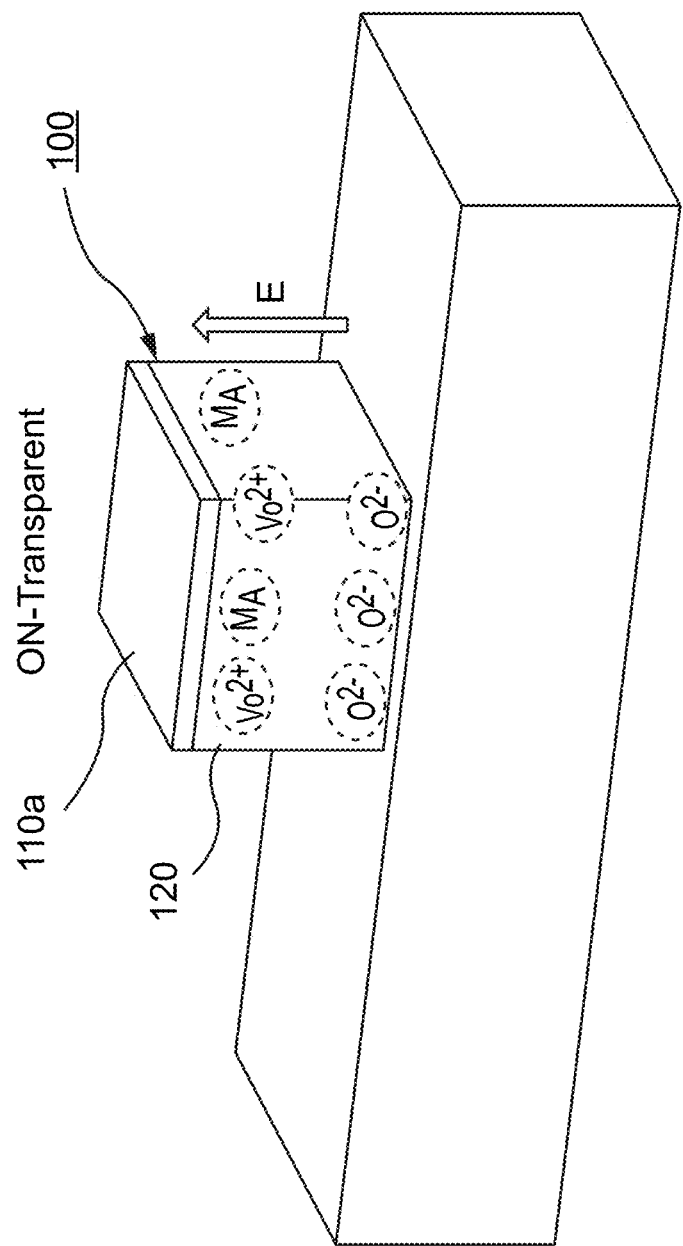

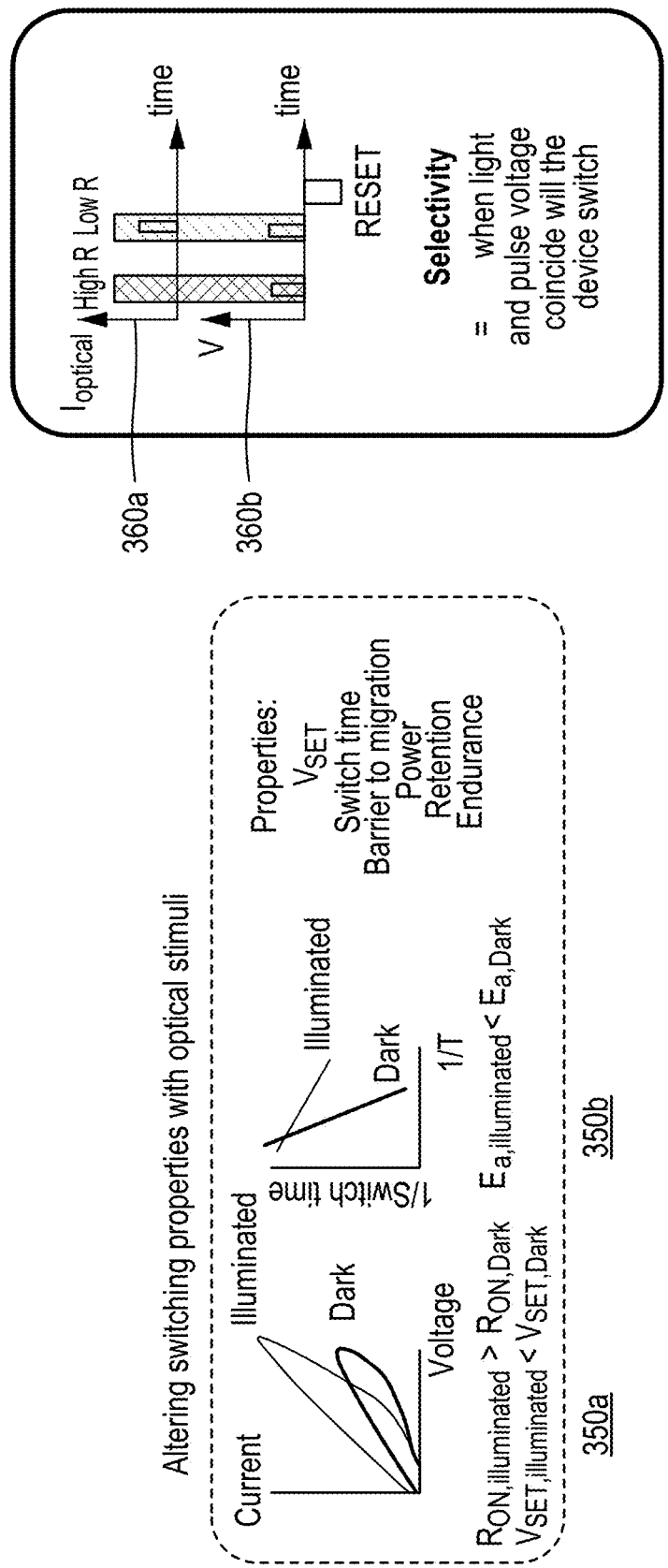

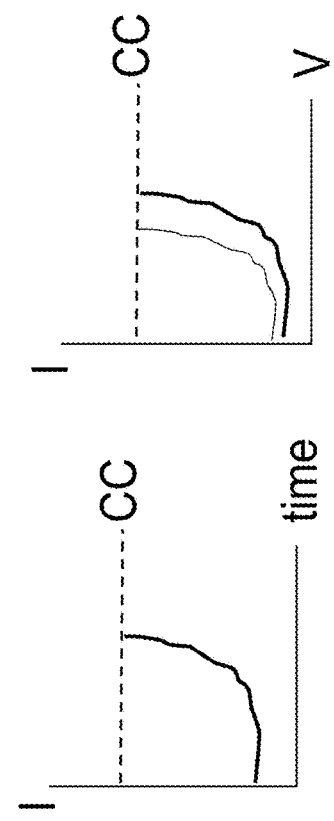
FIG. 6A
FIG. 6B
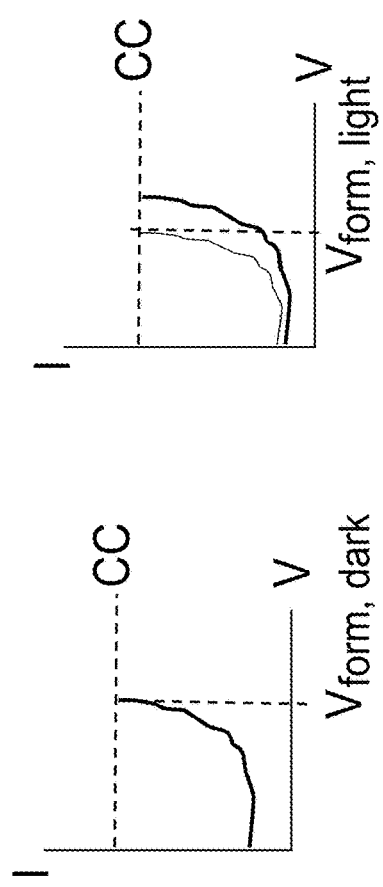
FIG. 6C
FIG. 6D
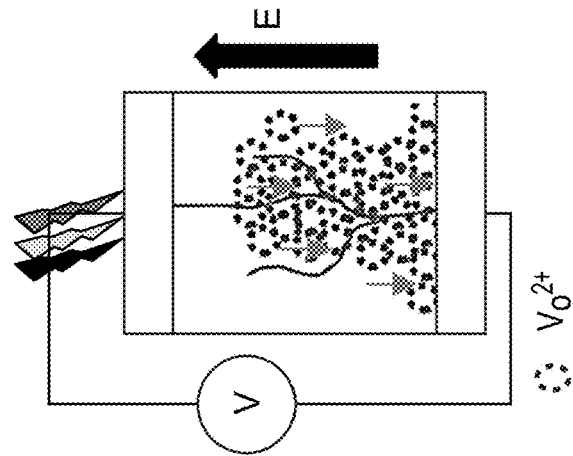
FIG. 6E
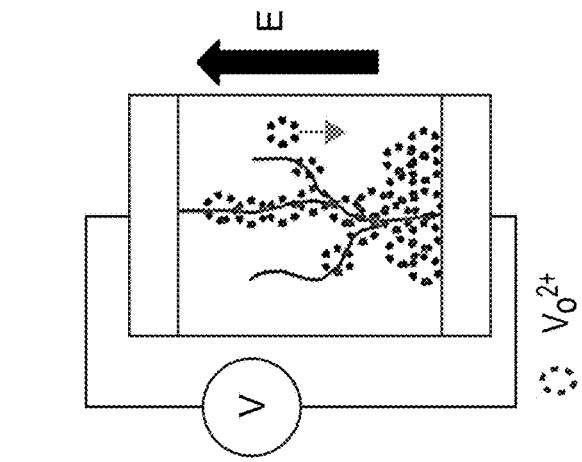
FIG. 6F

OPTOELECTRONIC MEMRISTOR DEVICES INCLUDING ONE OR MORE SOLID ELECTROLYTES WITH ELECTRICALLY CONTROLLABLE OPTICAL PROPERTIES

CROSS-REFERENCE TO RELATED APPLICATIONS

This application claims priority to U.S. Provisional Application No. 62/679,322 filed Jun. 1, 2018, titled "OPTO-ELECTRONIC MEMRISTOR", the entire disclosure of which is incorporated herein by reference.

STATEMENT OF GOVERNMENT SUPPORT

This invention was made with Government support under Grant No. DE-SC0002633 awarded by the Department of Energy, and Grant No. DMR-1419807 awarded by the National Science Foundation. The government has certain rights in the invention.

BACKGROUND

Metal oxide memristor devices are electronic memory devices that combine both fast and non-volatile behavior relying on solid-state ionic transport and reversible electrochemical reactions in the oxide. They have the potential to replace both dynamic random-access memory (DRAM) and flash memory technologies, thus enhancing the processing speed of current computers. They are also desirable candidates for neuromorphic computing, leading to the development of specialized hardware for efficient adaptive neural networks and video data processing. Some current drawbacks, however, of memristor/memristive devices, and anionic memristive devices in particular, include selectivity issues in crossbar arrays (presence of sneak current during the read process) due to two-terminal design. Another drawback is the time-voltage dilemma where, in term of material selection, switching speed can be opposite to engineering retention.

Yet another drawback with current metal oxide memristive devices is the high voltage required during electroforming, where a one-time, high-voltage/high-current forward bias step is applied to the memristive device to prime the device into a stable switching configuration. This step relies on either the formation of active defects under a high bias or the rearrangement of existing defects into a stable switching configuration (either a filament or a homogenous front). Filaments can form when the electric field concentrates locally, leading to further field enhancements and thereby increased ionic mobility. Switching of filaments is generally associated with a stochastic process, which results in higher variability in contrast to a homogenous front. This electroforming step generally requires time and high voltages/current, which result in high power consumption as well as materials degradation, which in turn reduces device yield.

SUMMARY

An optoelectronic memristor includes a first electrode transparent at a first wavelength, and a second electrode. It also includes a solid electrolyte disposed between the first electrode and the second electrode. The solid electrolyte has an electronic conductivity of about $10^{-10}$ Siemens/cm to about $10^{-4}$ Siemens/cm at room temperature. The optoelectronic memristor further includes a direct current (DC) voltage source, in electrical communication with the first electrode and the second electrode, to apply an electric field across the solid electrolyte. The electric field induces a spatial redistribution of ionic defects in the solid electrolyte, which causes a change in resistance of the solid electrolyte and a change in an optical property of the solid electrolyte at the first wavelength.

A method includes applying a direct current (DC) electric field to a solid electrolyte. The solid electrolyte has an electrical conductivity of about $10^{-4}$ siemens/cm or less at room temperature. The electric field induces a spatial redistribution of ionic defects in the solid electrolyte, the spatial redistribution causing a change in an optical property of the solid electrolyte. The method also includes sensing the change in the optical property of the solid electrolyte.

A spatial light modulator includes a crossbar switch and solid electrolyte material disposed at each crosspoint in the crossbar switch. The solid electrolyte has an electrical conductivity of about $10^{-10}$ siemens/cm to about $10^{-4}$ siemens at room temperature, and an optical property that varies due to a spatial redistribution of ionic defects in response to a direct current (DC) electric field.

A method includes applying an electric field pulse and an optical pulse to a solid electrolyte. The electric field pulse and the optical pulse overlap in time to induce a spatial redistribution of ionic defects in the solid electrolyte, which causes a change in an optical property and a change in an electrical property of the solid electrolyte. The method also includes sensing the change in the optical property and the change in the electrical property of the solid electrolyte.

A method includes applying an optical pulse to a solid electrolyte. The method also includes, after applying the optical pulse to the solid electrolyte, applying an electric field pulse to induce a spatial redistribution of ionic defects in the solid electrolyte. The spatial redistribution causes a change in an optical property and a change in an electrical property of the solid electrolyte. The method further includes sensing the change in the optical property and the change in the electrical property of the solid electrolyte.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

FIG. 1C illustrates the optical memristor device of FIG. 1A in an ON state.

FIG. 3C includes plots illustrating decreased switching voltage and increased switching speed (for a given voltage) when using a memristive oxide with optical gating.

FIG. 3D illustrates that switching can occur when an electrical pulse and optical pulse coincide on a memristive unit/oxide.

FIG. 6A is a current (Y axis) vs voltage (X axis) plot for a typical electroforming procedure without optical stimulus.

FIG. 6B is a current (Y axis) vs voltage (X axis) plot for a typical electroforming procedure with optical stimulus.

FIG. 6C is a current (Y axis) vs time (X axis) plot for a typical electroforming procedure without optical stimulus.

FIG. 6D illustrates current (Y axis) vs time (X axis) plot for a typical electroforming procedure with optical stimulus.

FIG. 6E illustrates defect formation during electroforming without optical stimulus.

FIG. 6F illustrates defect formation during electroforming with optical stimulus.

Figure 1A:
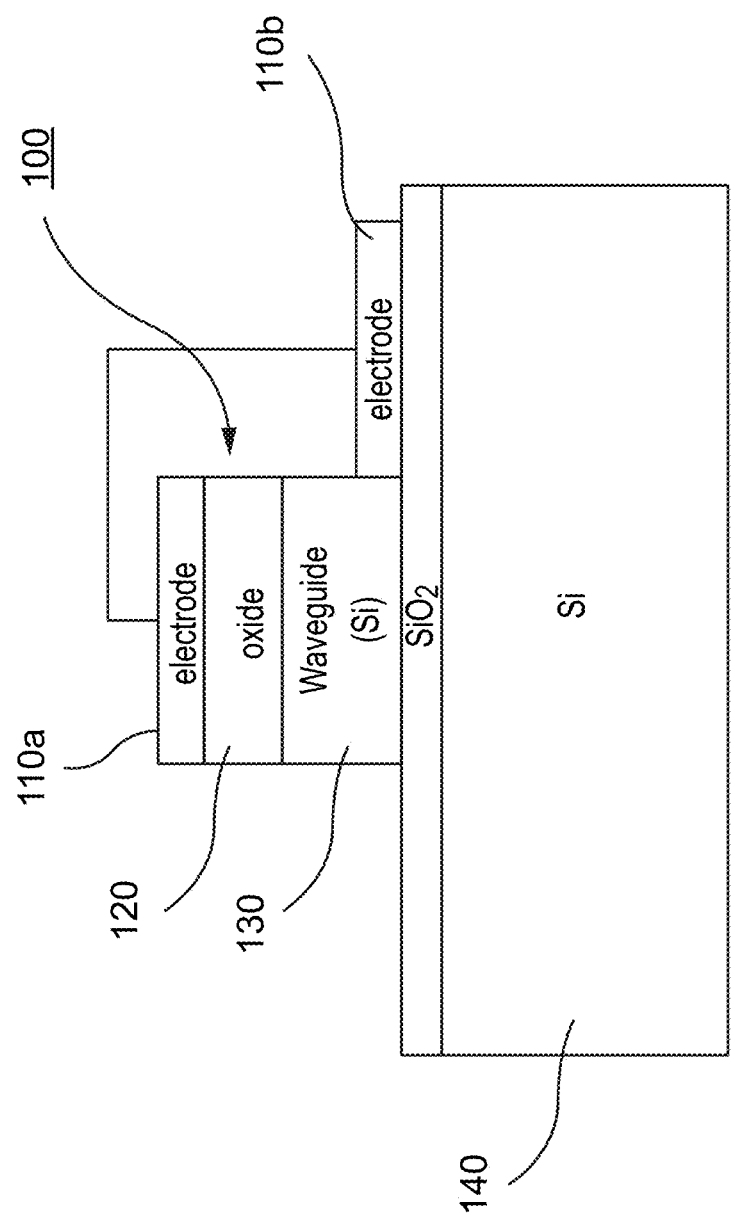
FIG. 1A illustrates an optical memristor device on top of a silicon waveguide.

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Following below are more detailed descriptions of various concepts related to, and implementations of optical/optoelectronic memristor devices, also sometimes referred to as "optoelectronic memristors", "optical memristors", "memristive devices", and variants thereof. Concepts introduced above and discussed in greater detail below may be implemented in numerous ways. Examples of specific implementations and applications are provided primarily for illustrative purposes to enable those skilled in the art to practice the implementations and alternatives apparent to those skilled in the art.

The figures and example implementations described below are not meant to limit the scope of the present implementations to a single embodiment. Other implementations are possible by way of interchange of some or all of the described or illustrated elements. Moreover, where certain elements of the disclosed example implementations may be partially or fully implemented using known components, in some instances only those portions of such known components that are necessary for an understanding of the present implementations are described, and detailed descriptions of other portions of such known components are omitted so as not to obscure the present implementations.

FIGS. 1A-ID illustrate an example optical/optoelectronic memristor device 100. The memristor device 100 includes a first electrode 110a and a second electrode 110b (collectively, electrodes 110) that can be coupled to a direct current (DC) voltage source (not shown). In some cases, at least the first electrode 110a, and optionally the second electrode 110b, can be optically transparent at a first wavelength, i.e., can have a transmittance of at least about 60%, at least about 70%, at least about 80%, at least about 90%, at least about 99%, about 100% at the first wavelength, including all values and sub-ranges in between. The first wavelength can be from about 400 nm to about 800 nm, including all values and sub-ranges in between. In some cases, the first wavelength can be from about 600 nm to about 1000 nm, including all values and sub-ranges in between. In some cases, the first wavelength can be from about 1 micron to about 3 microns, including all values and sub-ranges in between.

Figure 1B:
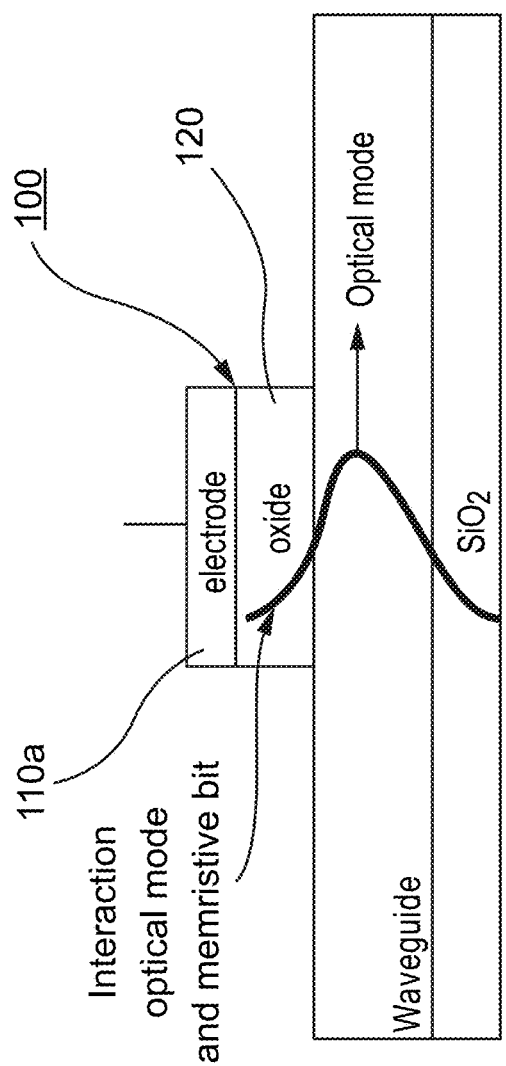
FIG. 1B is a cross-sectional representation of the optical mode in the silicon waveguide interacting with the optical properties of the memristive oxide of the optical memristor device of FIG. 1A by evanescent coupling.

The device 100 also includes a solid electrolyte, illustrated in FIGS. 1A-1B as an oxide layer 120. The solid electrolyte 120 can have an electronic conductivity from about $10^{-10}$ Siemens/cm to about $10^{-4}$ Siemens/cm at room temperature (e.g., at around 25° C.), including all values and sub-ranges in between. The thickness of the solid electrolyte can range from about 5 nm to about 200 nm. The solid electrolyte can be composed of one or more (i.e., at least one of, and can include combinations thereof) oxides, such as $CeO_2$, $SrTiO_3$, $Bi_2O_3$, $LaGaO_3$, $ThO_2$, $HfO_2$, or $ZrO_2$. The solid electrolyte 120 can be doped with one or more multi-valent cation dopants. The multi-valent cation dopant(s) can include at least one of Fe, Ti, Pr, Cr, Co, Cu, Mn, Eu, Er, Dy, Nb, or Ni. Without being limited by theory, the cation dopant(s) can induce the formation of ionic defects in the oxide such as, for example, oxygen vacancies, oxygen interstitials, metal (cation) vacancies, metal interstitials, and/or the like.

During typical operation, the DC voltage source can apply an electric field across the solid electrolyte 120 via the electrodes 110. This electric field induces a spatial redistribution of ionic defects in the solid electrolyte. In turn, this spatial redistribution causes a) a change in resistance of the solid electrolyte 120, and b) a change in at least one optical property of the solid electrolyte at the first wavelength. The change in resistance can be from about 100 ohms to about 100 megaohms, including all values and sub-ranges in between. The change in the optical property can be at least one of a change in refractive index, a change in absorption, or a change in plasma frequency. In some cases, the change in optical property can include a change in color of the solid electrolyte 120 in response to compensation of the multi-valent cation dopants by the ionic defects. The device 100 and/or the solid electrolyte 120 can be maintained at a temperature of up to 500° C. during such application of the electric field.

Figure 1D:
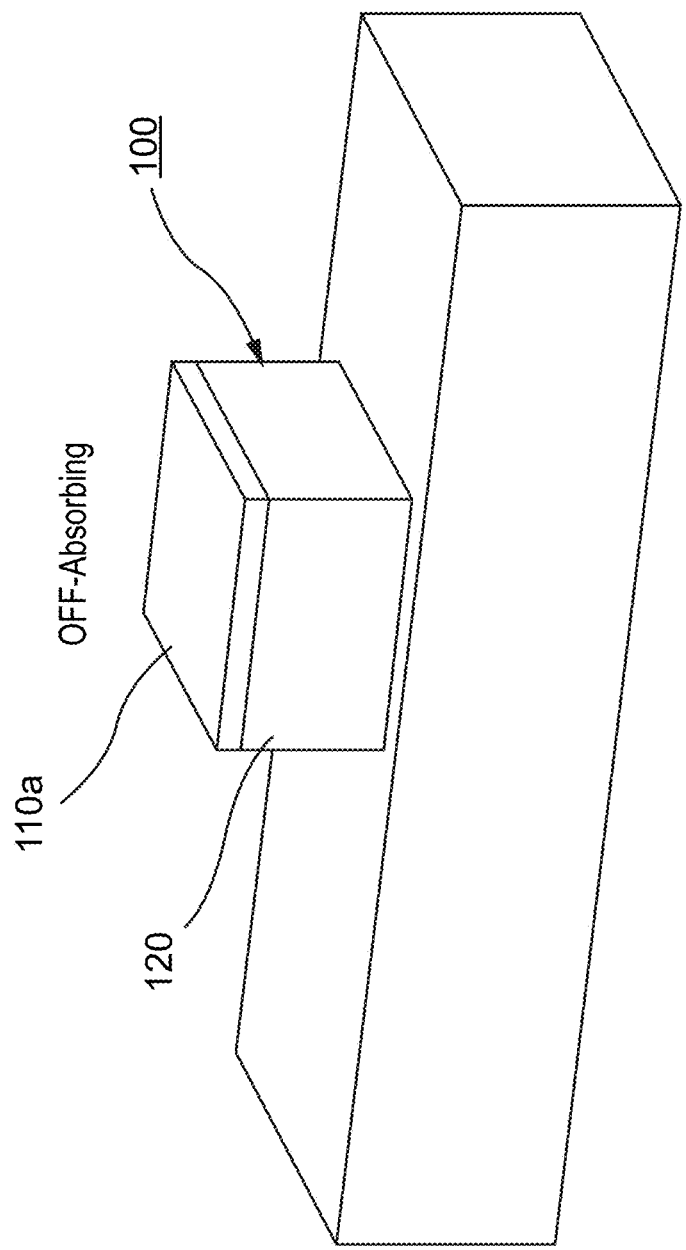
FIG. 1D illustrates the optical memristor device of FIG. 1A in an OFF state.

FIG. 1A illustrates the optical memristor device 100 acting as a switch for a silicon waveguide 130, which in turn is set on a substrate 140. In such cases, the electrodes 110 need not be transparent (e.g., can instead be highly opaque, such as highly reflective metal electrodes), since evanescent coupling can occur between the waveguide 130 and the solid electrolyte 120. FIG. 1B is a cross sectional-view of the setup of FIG. 1A and illustrates how an optical mode in the waveguide 130 (e.g., an example mode of a light wave in the waveguide) can interact with, and by affected by the optical properties of, the oxide 120 by evanescent coupling. FIG. 1C illustrates how, when the device 100 is in an ON state, which can result in inhomogeneous redistribution of ionic defects within the oxide 120, a change of complex refractive index (i.e., a change in the refractive index, in optical absorption, or both) occurs that results in losses of the optical mode interacting with the oxide 120, due to increased transparency of the oxide 120 to the optical mode. FIG. 1D illustrates how, when the device 100 is in an OFF state, e.g., after reversible switching from the ON state, the pristine optical properties of the oxide 120, as well as faithful transmission of the optical mode, is attained.

The device 100 can also include a light source (not shown) in optical communication with the solid electrolyte 120. This light source that can illuminate the solid electrolyte with light at another wavelength different from the first wavelength. In some cases, at least the first electrode 110a, and optionally the second electrode 110b, can be optically transparent at this other wavelength, i.e., can have a transmittance of at least about 60%, at least about 70%, at least about 80%, at least about 90%, at least about 99%, about 100% at this other wavelength, including all values and sub-ranges in between. This in turn can promote the spatial redistribution of the ionic defects in the electrolyte 120. The device 100 can also include additional optical components such as, for example, a lens in optical communication with the light source and the solid electrolyte that collimates the light at the second wavelength. The device 100 can also include additional optical components such as, for example, a spatial light modulator in optical communication with the light source and the solid electrolyte, such that readout from the device 100 can be based not only on the state of the solid electrolyte but also the spatial modulation of the light be the solid electrolyte. Such higher order readout capabilities can be useful in machine learning techniques such as neural networks, where both the weight of each node as well as the geometry are accounted for when processing test data.

The device 100 can also include a photodetector in optical communication with the solid electrolyte via the first electrode that can detect the change in the optical property of the solid electrolyte at the first wavelength. When the second electrode is transparent at the first wavelength the photodetector can be in optical communication with the solid electrolyte via the second electrode in order to detect the change in the optical property of the solid electrolyte at the first wavelength.

Upon removal of the electric field, the spatial redistribution of the ionic defects can be reset, thereby enabling use of the device 100 as volatile memory. Resetting of the spatial redistribution can be generally characterized as the various ionic defects in the device 100 returning to their original distribution.

Figure 12:
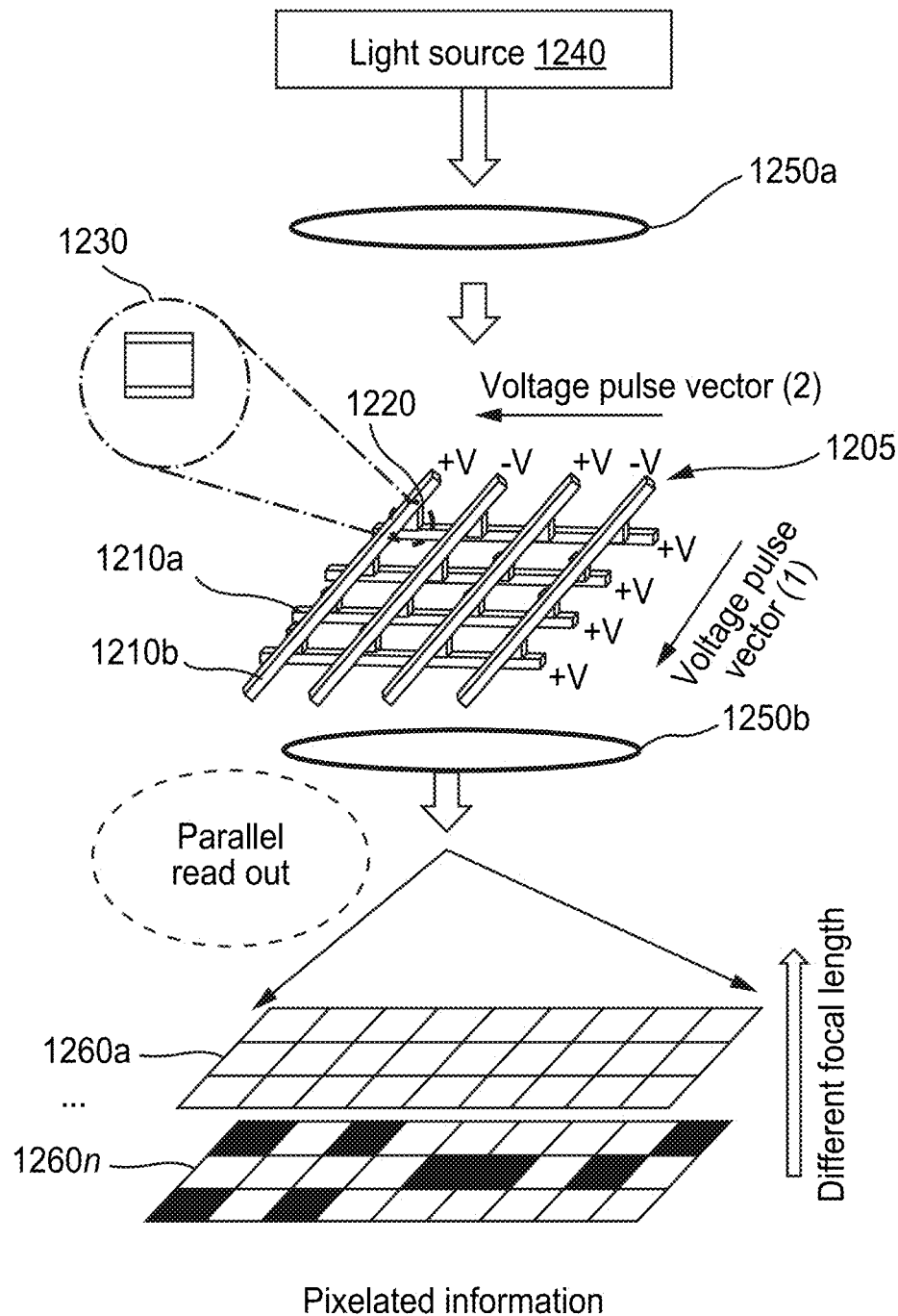
FIG. 12 shows an example crossbar switch including an optical memristive device.

As explained in greater detail for FIG. 12, the memristor device 100 can be included in a spatial light modulator that includes a crossbar switch, and solid electrolyte material (e.g., the electrolyte 120) disposed at each crosspoint in the crossbar switch. The solid electrolyte can have an electrical conductivity of about $10^{-10}$ siemens/cm to about $10^{-4}$ siemens at room temperature. An optical property of the solid electrolyte can vary due to a spatial redistribution of ionic defects in response to a direct current (DC) electric field.

Figure 2A:
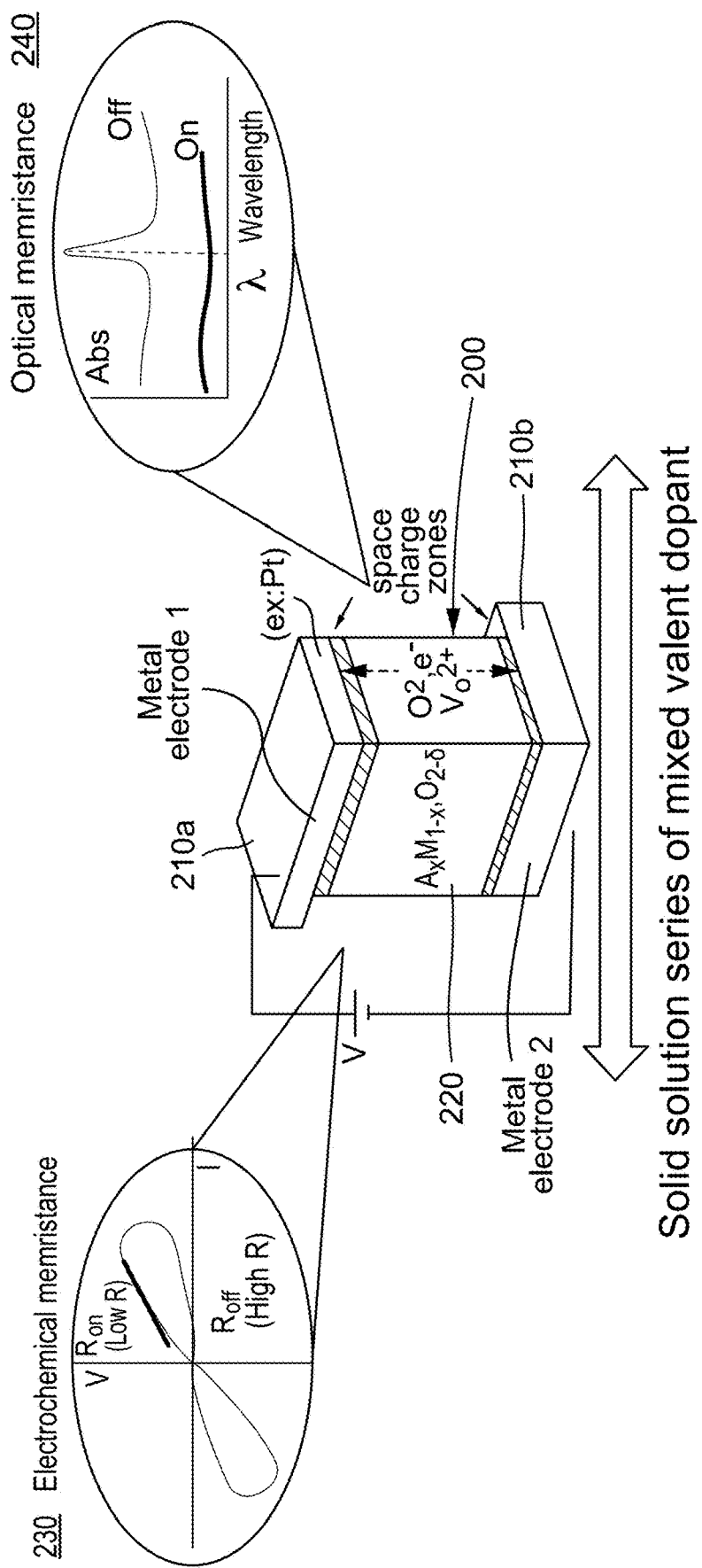
FIG. 2A illustrates a memristive oxide doped with mixed valent cations, including the memristive oxide's electrochemical memristance and optical memristance characteristics.
Figure 2B:
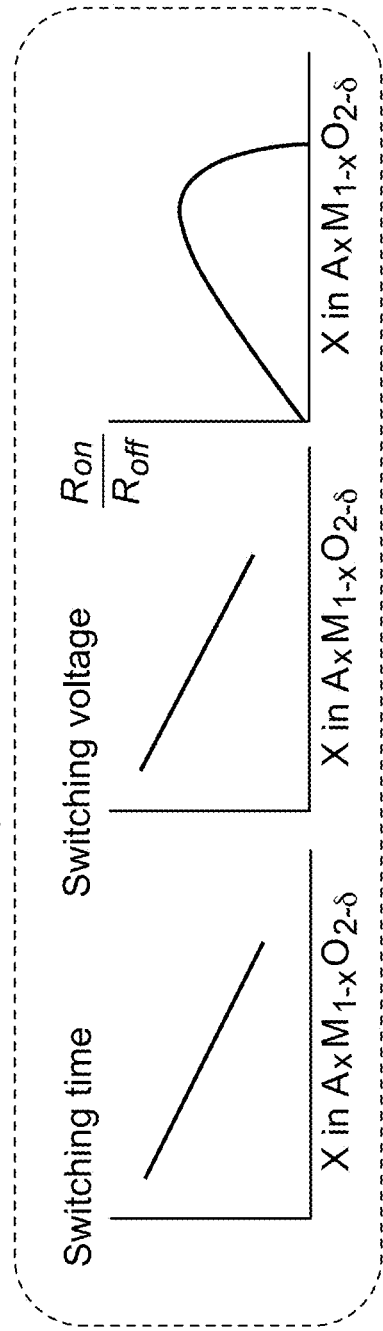
FIG. 2B includes plots illustrating the enhanced resistive switching properties of the memristive oxide of FIG. 2A.
Figure 2C:
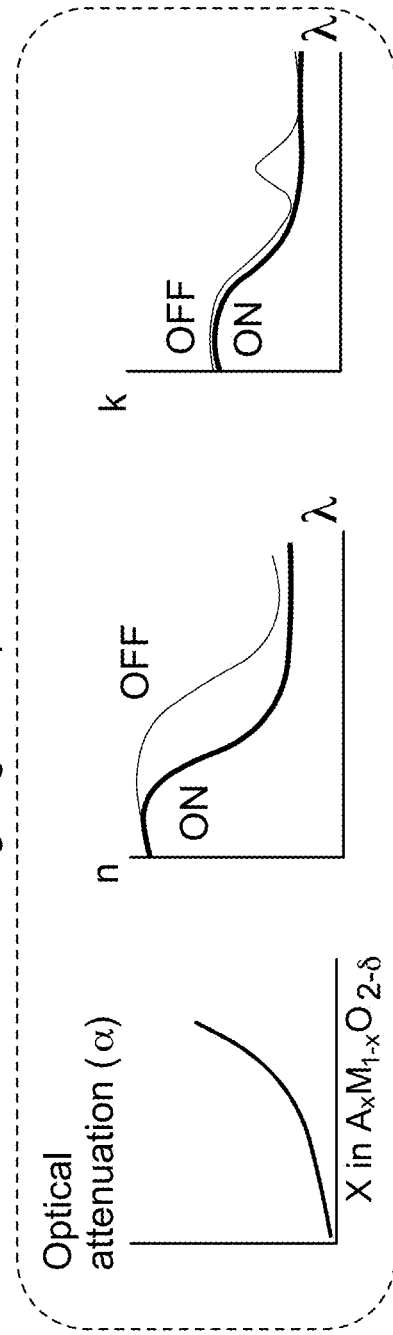
FIG. 2C includes plots illustrating the optical reactivity of the memristive oxide of FIG. 2B.

FIGS. 2A-2C illustrate an optoelectronic memristor device 200, and characteristics thereof. The optoelectronic memristor device 200 can be structurally and/or functionally similar to the memristor device 100 shown in FIG. 1A unless explicitly noted otherwise. The optoelectronic memristor device 200 includes a solid electrolyte or oxide layer 220 (also sometimes referred to as a "first solid electrolyte"), and electrodes 210a, 210b. The material of the oxide layer is generally characterized as having a Perovskite composition $A_xM_{1-x}O_{2-\delta}$ due to the doping of the oxide with a mixed valence cation, where 'A' is the cation at the corners of the lattice of the crystal structure of the material, 'M' is the ion at the center of the lattice, 'O' denotes oxygen, 'X' and '1−X' represent the relative number of A and M atoms in the lattice, and '2−δ' represents the range of the number of oxygen atoms in the lattice. The device 200 also includes a first electrode 210a and a second electrode 210b composed of, for example, platinum. FIG. 2A illustrates space charge zones between each electrode and the oxide 220.

Without being limited by theory and/or any particular mode of operation, space charge zones or layers can exist when high conductivity (e.g., metallic) electrodes, such as the electrodes 210a and 210b, come in contact with a relatively more insulating oxide (e.g., the oxide layer 220) typically results in a space charge layer at the interface between the oxide and the electrode. These space charge zones/layers can arise due to differences in work functions and electron affinities of the electrode and oxide materials and can factor into the electrical resistive switching phenomena described herein. Specifically, upon redistribution of ionic defects after application of electrical bias, one of the sides of the layer becomes oxygen deficient. This can result in modulation of the space charge potential at the interface between the oxide and the electrode and can form the basis for the change in resistance of the device upon application of electrical bias.

Graph 230 of FIG. 2A illustrates the electrochemical memristance of the device 200. Specifically, the graph 230 illustrates sustainable cyclability between a high electrochemical memristance in the OFF state (Ro) and a low electrochemical memristance in the ON state ($R_{on}$). Graph 240 of FIG. 2A illustrates the optical memristance of the device 200 that is induced by the electrochemical memristance. Specifically, the graph 240 illustrates that the device 200 exhibits relatively lower absorbance (i.e., high transmittance) in the ON state and higher absorbance in the OFF state with an absorbance peak at a characteristic wavelength associated with the cation dopant(s) present in the oxide 220.

The extent of the absorbance depends on the oxidation state of the cation dopant, which depends on how many oxygen defects are present in the oxide 220. Less oxygen defects will result in greater absorption and a higher absorption peak, and more oxygen defects will result in lower absorption (i.e., increased transparency) and a lower absorption peak. This means that during use, when a gradient in oxygen concentration is created in the device 200, one side of the device we have an oxygen rich region and on the other we have an oxygen poor region. This can manifest as one side having a color characteristic of the absorbance peak wavelength, while the other will be partially or substantially transparent.

FIG. 2B illustrates how the extent of doping of the oxide 220 with the cation can be optimized to reduce or minimize switching voltage (i.e., switch using lower voltages due to higher vacancy concentration, see left panel), reduce or minimize switching time (i.e., achieve faster switching times due to higher vacancy mobility, see middle panel), and achieve an optimum ratio of $R_{on}/R_{off}$ (due to vacancy interaction, see right panel). As illustrated, the switching voltage and switching time are correlated with the dopant concentration, since the greater the extent of doping, the greater the number of ionic defects introduced. However, excessive doping can result in the oxide 220 undergoing a phase transition, where the ionic defects can become immobile and switching may not be possible.

Also illustrated in FIG. 2B is how the highest contrast/ratio between Ro and Rdr is determined since it can inform the doping level required for a desired balance between the fast switching time, low switching voltage, and result in the largest optical contrast (i.e., responsiveness to optical stimulus) possible.

FIG. 2C illustrates how optical losses can be estimated to introduce optical reactivity into the device 200. Specifically, FIG. 2C illustrates measurement of optical attenuation (a) of light based on the extent of doping (left panel), and shows that the larger the concentration of the dopant(s), the larger the optical absorption/attenuation at the first wavelength. The larger the optical attenuation, the larger the optical contrast exhibited by the device 200 upon switching. Also illustrated is the change in the refractive index (middle panel) and in the extinction coefficient (right panel) as a function of the wavelength, for each of the ON and OFF states of the device 200.

Figure 3A:
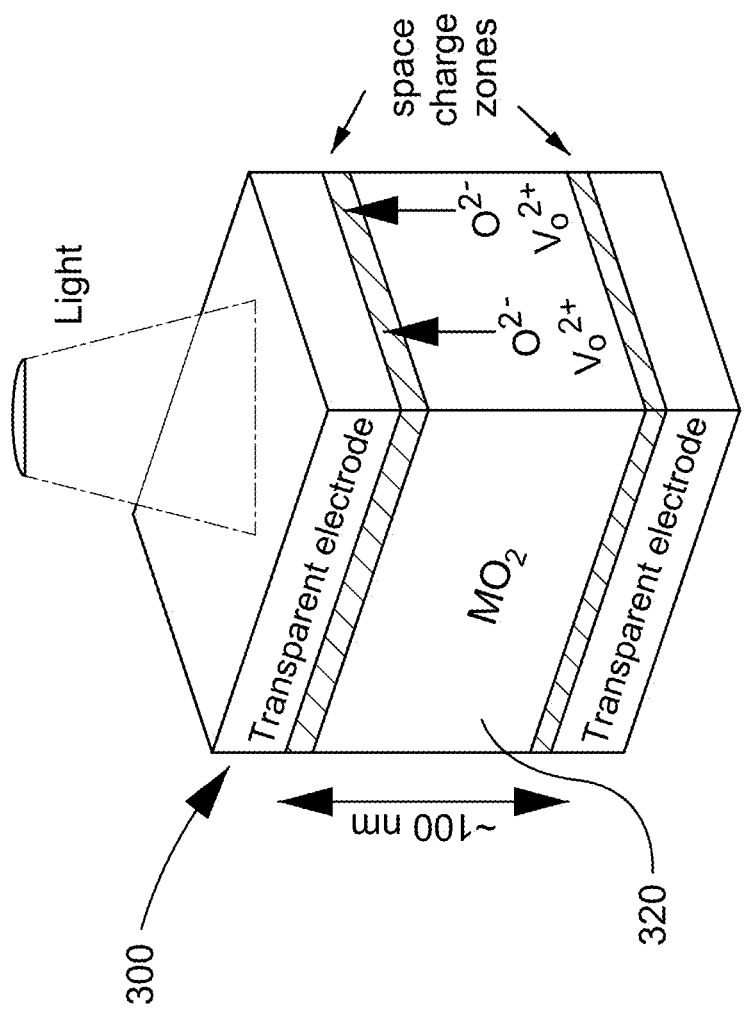
FIG. 3A illustrates a memristive oxide with optical gating.

FIGS. 3A-3D illustrate application of an optical (e.g., visible or UV light) signal to an optoelectronic device 300, where the sensitivity of the device to the optical signal can permit it to operate as having a non-contact third terminal to modulate the barrier to defect migration of a doped oxide layer 320 during switching. FIG. 3A is an illustration of an optical signal applied to the device 300, which can be structurally and/or functionally similar to the memristive devices 200, 100, and the oxide layer can be about 100 nm thick as illustrated.

Figure 3B:
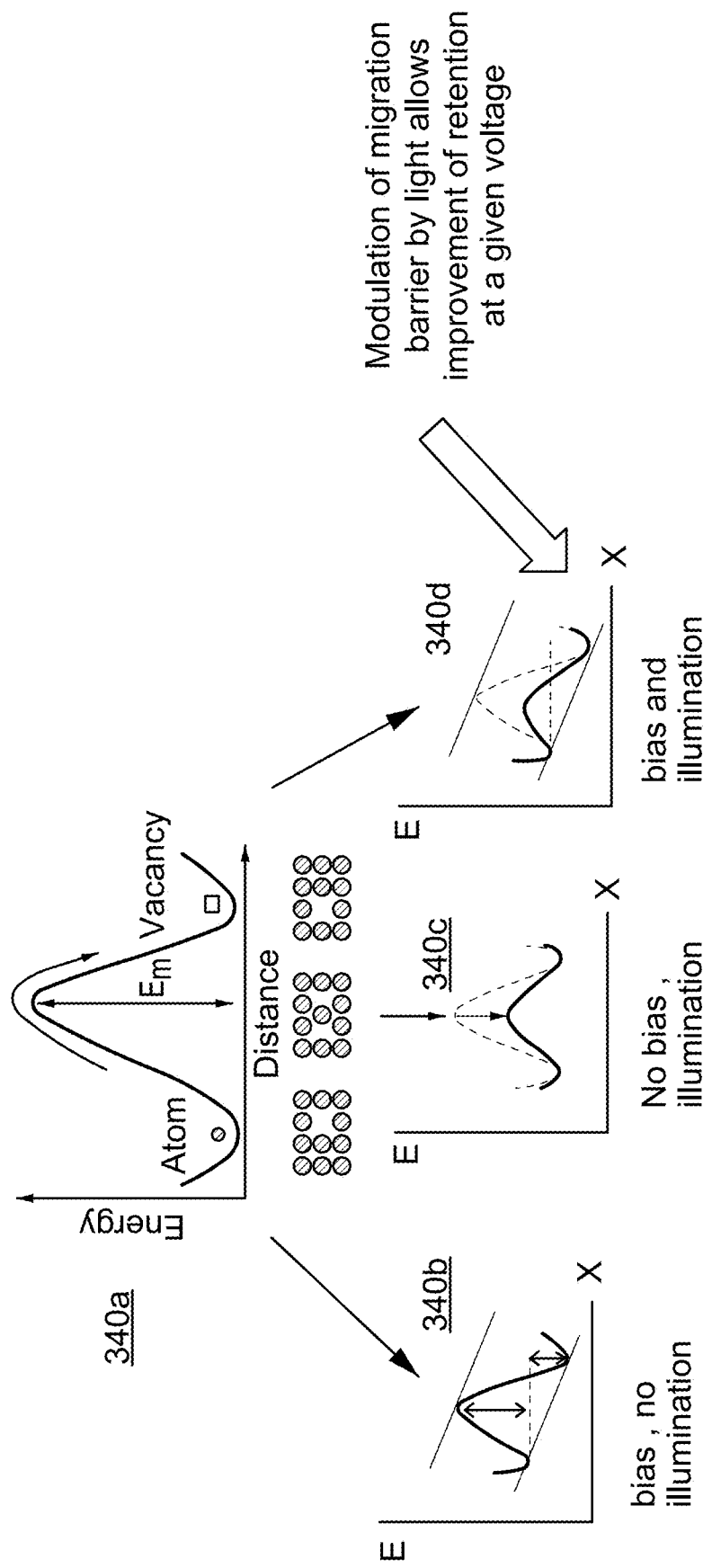
FIG. 3B is a plot illustrating how visible light/UV optical gating as a non-contact third terminal modulates the barrier to defect migration of the memristive oxide during switching, resulting in a reduction of the barrier to defect migration.

FIG. 3B illustrates, at plot 340a, an energy barrier (i.e., a barrier to defect migration during switching) of the device 300. Plot 340b illustrates how application of an electrical bias, without any optical signal/illumination, modulates the energy barrier by lowering the energy level of the vacancy. Conversely, Plot 340c illustrates how application of an optical signal as illustrated in FIG. 3A lowers the peak of the energy barrier. Plot 340d then illustrates how concurrent application of an electrical bias and optical signal modulates the migration barrier in a manner that can lower the switching voltage due to the reduced peak, increase switching speed, as well as improve retention by virtue of the lowered energy level of the vacancy.

FIG. 3C illustrates how using an optical signal/stimulus in conjunction with electrical bias alters switching properties of the device 300 relative to using bias alone (i.e., in the "dark"). Panel 350a illustrates how $R_{on}$ is increased with optical stimulus (referred to here as $R_{on,\ illuminated}$) relative to using bias alone ($R_{on,\ dark}$), which in turn results in an increased value of achievable $R_{on}/R_{off}$, and increased electrical contrast. Panel 350a also shows how the voltage $V_{SET}$ of the inflexion point of each curve (i.e., the point where the current exhibits a non-linear, higher order behavior with respect to the voltage) is lower with optical stimulus. Panel 350b illustrates that switching speed (i.e., the reciprocal of switching time, plotted against the reciprocal of the temperature) also falls at a much lower rate with combined electrical bias and optical stimulus ("illuminated") than with bias alone ("dark"). The slope of the curve represents the energy of migration of the ionic defects, with a shallower slope indicating lower energy of migration. This can be a consequence of the increased ionic mobility which comes from a decreased ionic migration barrier.

FIG. 3C also includes a listing of device properties and characteristics that can be modified with the use of optical stimulus, including (but not limited to) $V_{SET}$, switching time, the barrier to migration, power consumption, retention, and endurance (i.e., increased shelf life and operating time for the device due to lower power consumption and corresponding lower thermal damage due to cycling between ON and OFF states). Specifically, application of bias can reduces the size the migration barrier and result in faster moving defects. This in turn can result in lowered switching voltage for a given switching time, or lower switching time at a given switching voltage. This can enable lower power requirements for operation, which results in improved endurance and retention.

FIG. 3D illustrates how the device 300 can be tuned to exhibit selectivity, such that switching occurs when both electrical bias and optical stimulus are present. Timing diagrams 360a, 360b illustrate application of optical current, bias voltage via a voltage pulse, respectively. When only the bias is applied, the device 300 remains in an OFF state, with high resistance. When both the bias and the optical signal coincide temporally, the device 300 enters the ON state with low resistance. A RESET electrical signal can be applied to switch the device back to an OFF state thereafter.

Figure 4A:
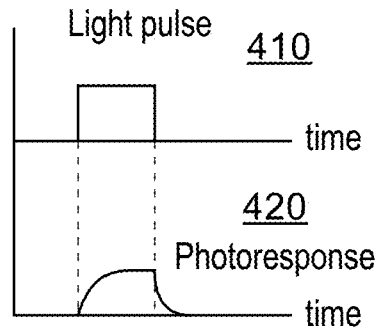
FIG. 4A illustrates a timing diagram of a photoresponse of the memristive oxide of FIG. 3A in response to the light pulse of FIG. 3D.
Figure 4B:
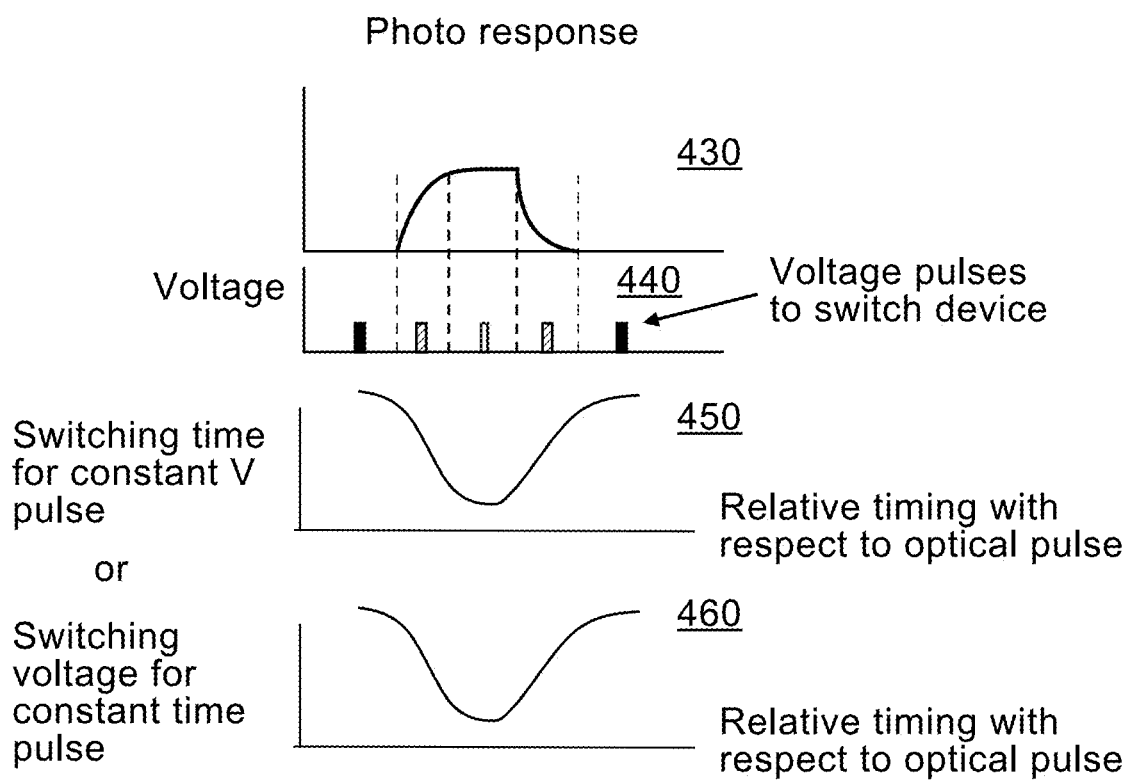
FIG. 4B illustrates timing, switching time, and switching voltage for voltage pulses to induce switching with respect to the photoresponse of FIG. 4A.

FIGS. 4A-4B illustrate how parameters of the voltage pulse of FIG. 3D can be selected based on its relative timing with the optical stimulus/light pulse. FIG. 4A illustrates how the light pulse (upper plot 410) induces a photoresponse, i.e., a photocurrent (lower plot 420) (e.g., a modification of the migration barrier, as illustrated in FIG. 3B) in the memristor device. If the light pulse has a substantially square wave profile as illustrated, the photoresponse/photocurrent can increase from the time of the light pulse's leading edge till it saturates or levels out. The illustrated light pulse in FIG. 4A has a width greater than the transient response time (i.e., the rise time) of the photoresponse, such that the photoresponse is nonlinear due to saturation. The width of the light pulse can be shorter or substantially similar to the transient response time, such that the photoresponse exhibits mostly linear behavior. After the light pulse, the photoresponse decays, at a rate that can be similar to or different from the transient response time. The photoresponse can lag behind the light pulse based on factors such as (but not limited to) the intensity of the light pulse, the wavelength/wavelength range of the light pulse, the carrier excitation lifetime of the oxide layer, the recombination lifetime of the oxide layer, and/or the like.

Plots 430-460 of FIG. 4B illustrate how switching time (plot 450) and switching voltage (plot 460) vary with the timing of the voltage pulse (plot 440) relative to the photoresponse (430). Plot 440 illustrates different timings of the voltage pulse relative to the photoresponse, including before the photoresponse, during a ramp-up stage of the photoresponse, during a level stage of the photo response, during a decay stage of the photoresponse, and after. Plot 450 illustrates how, for a given switching voltage, the lowest switching time to cause the device to switch is obtained when the voltage pulse is applied during the middle or latter portion of the photoresponse, and is higher when applied outside this window. As illustrated in the plot 450, a minimum value of the switching time is obtained during or near saturation of the photoresponse. Since the transient photoresponse time is fixed for a given light pulse, the amount of time after application of the light pulse (i.e., after the rising edge of the light pulse) when the voltage pulse can be applied to obtain minimum switching time will depend on the width of the light pulse. For example, a short transient response time and a long optical pulse can mean that the voltage pulse can be applied any time after (say) 99% of the optical pulse width. A long transient response time and a short optical pulse, on the other hand, can result in a narrow window to apply the voltage pulse.

The duration/width of the voltage pulse also plays a role. For example, if the light pulse width is less than the transient photoresponse time, then the photoresponse will not saturate. In such cases, the voltage pulse can be timed to overlap with the light pulse such that the end of the light pulse coincides with the middle of the voltage pulse. Plot 460 illustrates that, for a constant voltage pulse time (i.e., voltage pulse width), the switching voltage required to cause the device to switch is also lowest when applied in the same time window, i.e., during or near saturation. It is understood that while plots 430-460 illustrate a rising transient response time that is equal to the decay time and that the light pulse is wider than the electrical pulse, this need not always be the case. The decay time can sometimes be longer than the rise time, and in such scenarios, the optical pulse width can be smaller than the electrical pulse width. The optical pulse width can depend on the transient rise time, and even if saturation is not achieved, a large electrical pulse width can still be used due to persistence in the oxide layer.

Figure 5B:
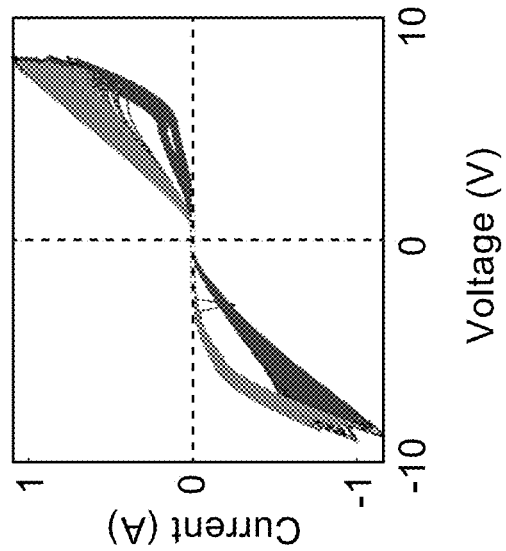
FIG. 5B is a plot illustrating the non-volatile, retentive behavior exhibited by the memristor device of FIG. 5A.
Figure 5A:
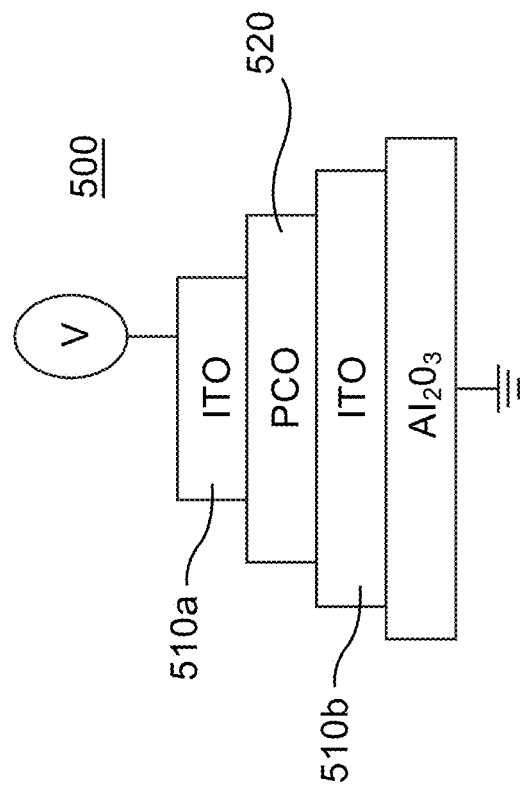
FIG. 5A is a schematic of the various layers of an example memristor device.
Figure 5C:
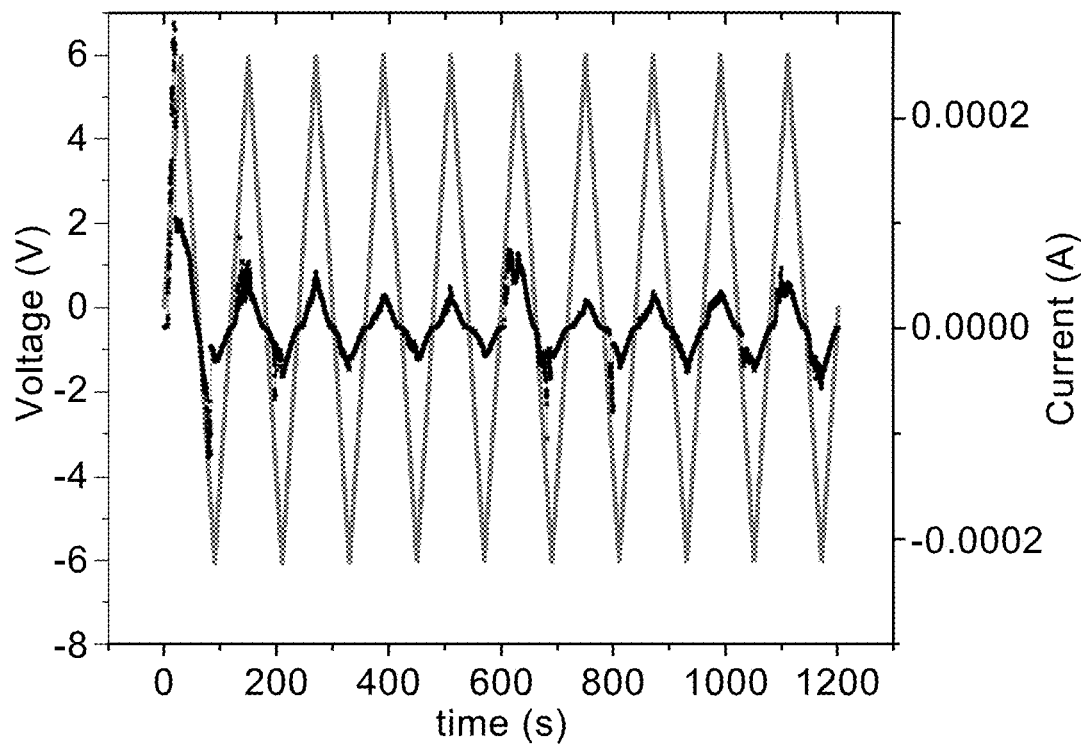
FIG. 5C is a plot of applied voltage and measured current for the memristor device of FIG. 5A and is representative of the electrical switching characteristics of the memristor device.
Figure 5D:
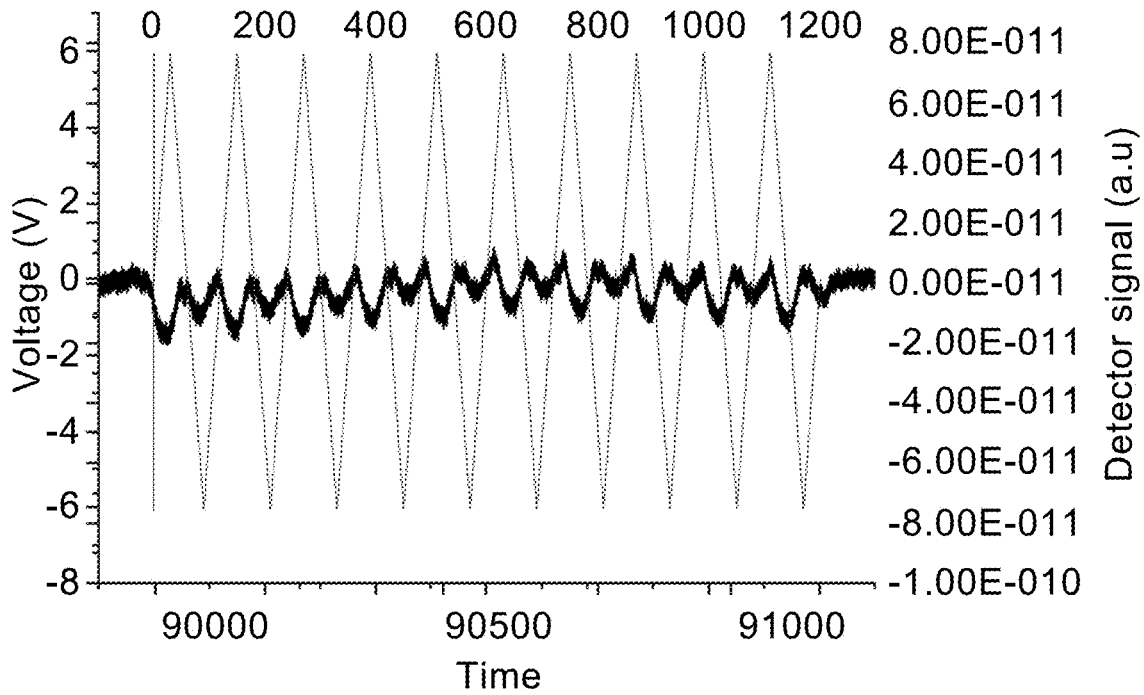
FIG. 5D is a plot of applied voltage and measured optical response (as a detector signal) for the memristor device of FIG. 5A and is representative of the optical response characteristics (i.e., in response to electrical switching) of the memristor device.

FIG. 5A illustrates an example optical memristor device 500 that includes first and second electrodes 510a, 510b respectively, that are composed of ITO (indium tin oxide). The optical memristor device 500 also includes a solid electrolyte/oxide layer 520 composed of $PrCeO_2$ (i.e., $CeO_2$ doped with Pr), and rests on a substrate 530 of $Al_2O_3$. FIG. 5B illustrate a current-voltage plot for the optical memristor device 500 that illustrates switching characteristics, and indicates volatile behavior of the optical memristor device 500. FIG. 5C shows The electrical switching characteristics of the device 500, while FIG. 5D shows the optical response characteristics of the device 500.

FIGS. 6A-6E illustrate improvements to electroforming by the optoelectronic memristor device designs disclosed herein where a one time, high voltage/high-current forward bias step is applied to the memristive device to prime the device into a stable switching configuration. This electroforming step relies on both the formation of active defects under a high bias, and on rearrangement of existing defects into a stable switching configuration (either a filament or a homogenous front) via the application of bias. Filaments can form when the electric field concentrates locally, leading to further field enhancements and thereby increased ionic mobility. Switching of filaments is generally associated with a stochastic process, which results in higher variability in contrast to a homogenous front. This electroforming step generally requires time and high voltages/current, which result in high power consumption as well as materials degradation, which in turn reduces device yield FIG. 6A is a plot of a high voltage, high current (up to the compliance current CC) forward bias that is typically applied to a memristive device as disclosed herein to prime the device into a stable switching configuration. FIG. 6B is a plot illustrating how, when an optical stimulus is used in addition to the electrical bias, a lowered bias voltage is required to reach the compliance current. As a result, the time and high voltage, as well as power, for electroforming are reduced.

FIG. 6C is a plot of a typical current vs time profile for an electroforming procedure where a constant voltage is applied for a period of time until the current rises to a set compliance current. At the beginning of the applied voltage, the current remains constant since the resistance of the oxide layer remains constant. After a certain amount of time, the defect rearrange, which reduces the overall resistance of the system and resultin a rapid rise in current as illustrated.

FIG. 6D is a typical current vs time profile for an electroforming procedure under illumination, under similar voltage conditions as FIG. 6C. The initial/starting current is larger with illumination than in the dark, and the current rise occurs earlier with illumination than in the dark.

FIG. 6E illustrates some issues that can arise with the use of electrical bias alone, namely the formation of filaments of defects due to local electric field concentration, and due to defect formation/rearrangement alongside existing defects. Switching in such filaments is generally stochastic, and can lead to variable, unpredictable behavior. FIG. 6F illustrates how, when optical stimulus is used in addition to electrical bias during electroforming, a more 'homogenized' front is realized for the ions due to more homogeneous defect arrangement, and more predictable switching is achieved.

Figure 7A:
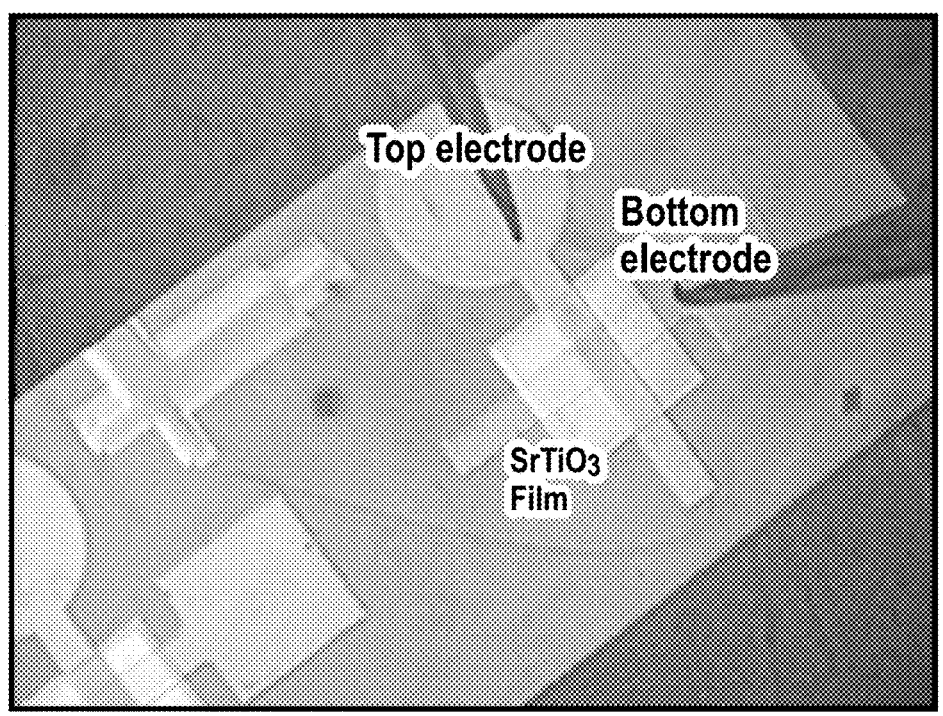
FIG. 7A is a picture showing layers of an example memristor device.

FIG. 7A shows an example setup of an optoelectronic memristor device with a top electrode, a bottom electrode (both electrodes are 100 μm thick and made of ITO), and a 200 μm $SrTiO_3$ oxide layer in between.

Figure 7B:
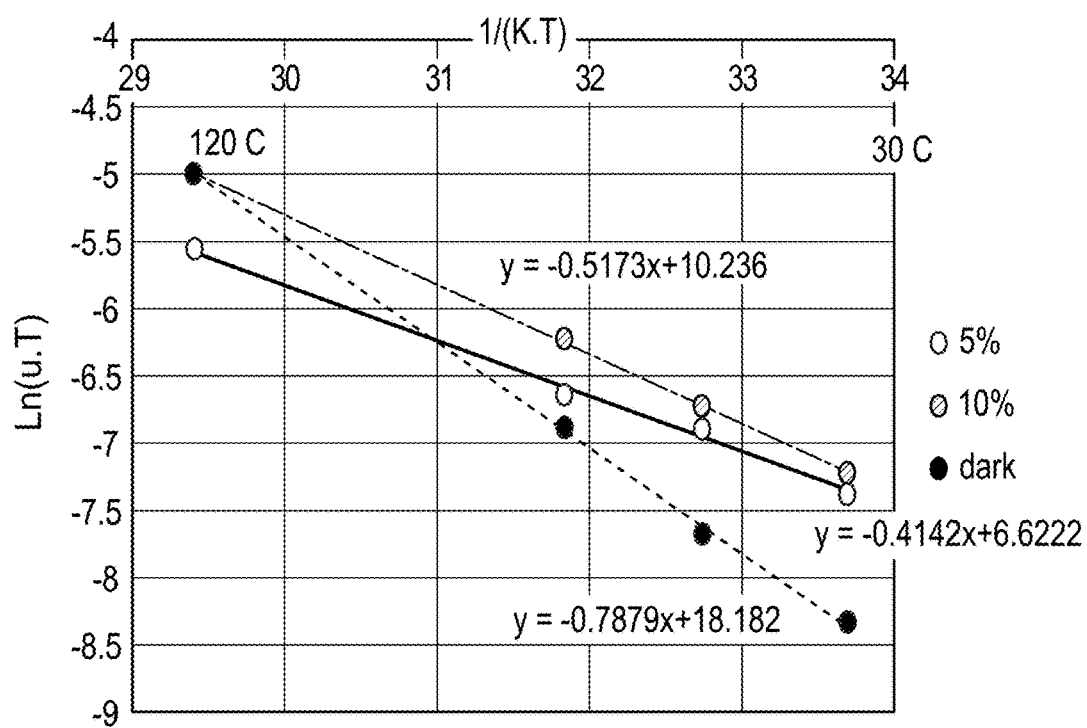
FIG. 7B is a plot of (the natural log of) the product of mobility and temperature (Y axis) vs the product of the inverse of the temperature and the Boltzmann constant (eV)(X axis).

FIG. 7B illustrates experimental data based on transient current measurements that show how the ionic migration barrier is reduced under optical illumination in an optical memristive device with an ITO electrode, a oxide layer of crystal $SrTiO_3$ of 500 μm thickness, and an Al electrode. The plot of FIG. 7B demonstrating how the ionic mobility in the $SrtiO_3$ layer can be modified at temperatures below 120° C. by visible light illumination. The solid dots and their corresponding line illustrates typical mobility in the dark, while ionic mobility under illumination is increase for the lines with the empty (5%=12 mW) and striped (10%=24 mW) dots.

Figures 8A, 8B:
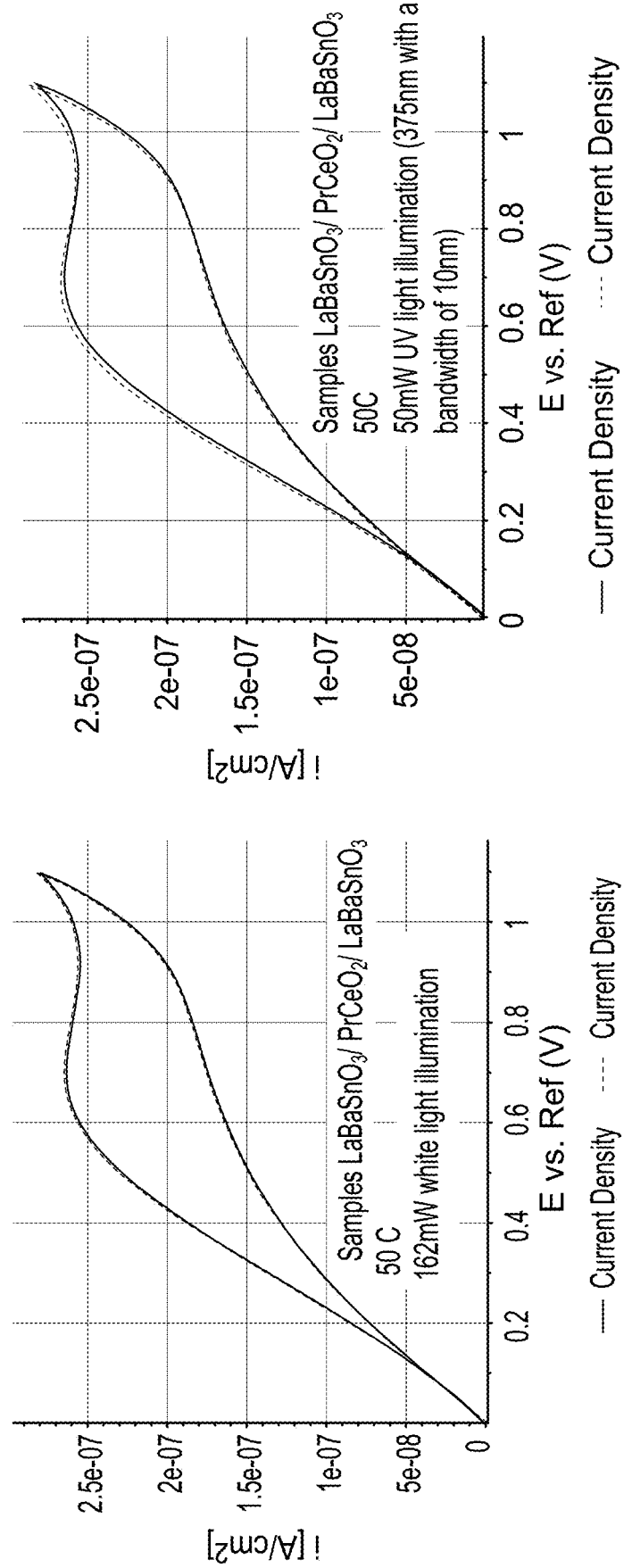
FIG. 8A is a plot of (the natural log of) the product of mobility and temperature (Y axis) vs the applied voltage (eV)(X axis) for an example optical memristive device with white light illumination.
FIG. 8B is a plot of (the natural log of) the product of mobility and temperature (Y axis) vs the applied voltage (eV)(X axis) for the optical memristive device of FIG. 8A with ultraviolet (UV) light illumination.
Figure 8C:
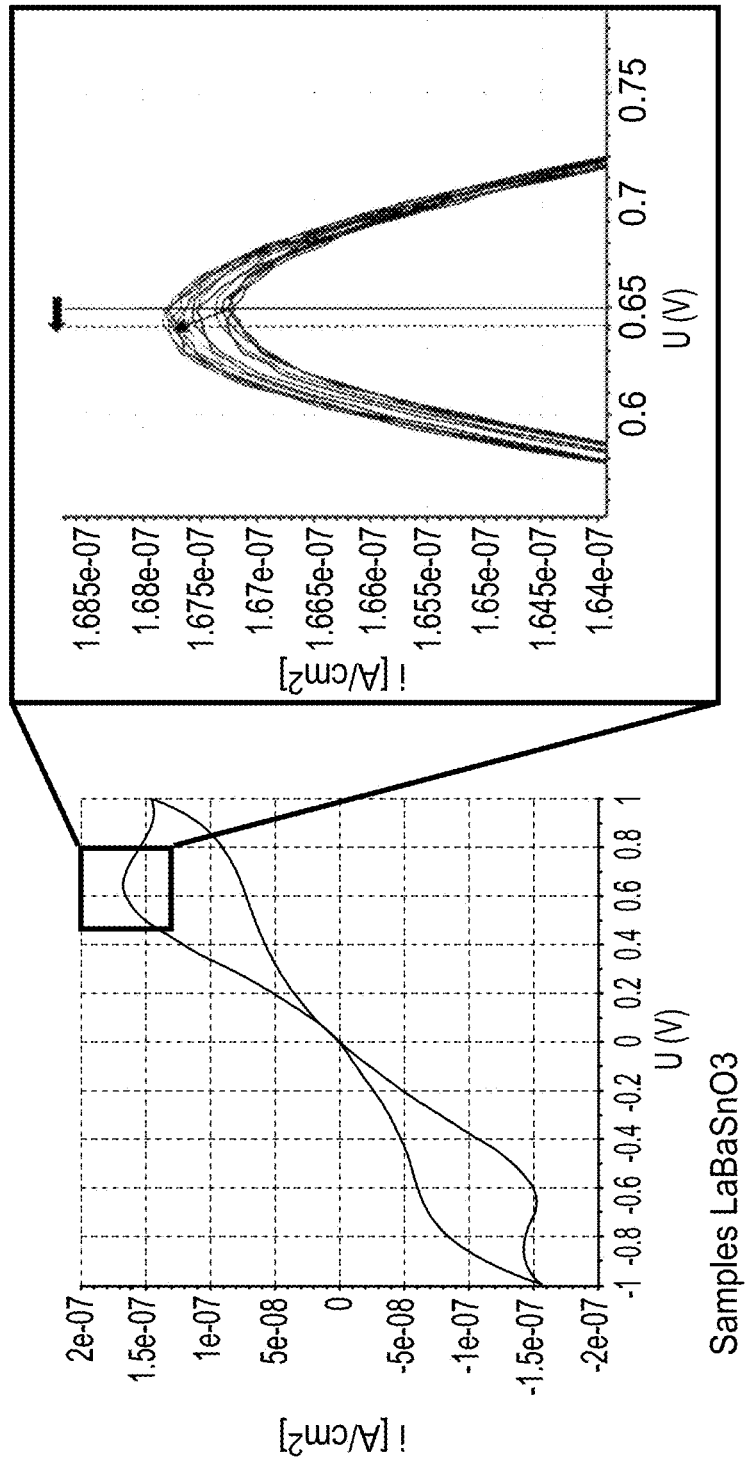
FIG. 8C is a plot of (the natural log of) the product of mobility and temperature (Y axis) vs the applied voltage (eV)(X axis) for the optical memristive device of FIG. 8A with ultraviolet (UV) light illumination having an intensity in a range from 0 mW to 50 mW, and illustrating multiple curves corresponding to the range of UV light intensities. A portion of the plot is magnified to show the shift in the peak of the curves based on the UV light intensity.

FIGS. 8A-8C illustrate device characteristics for an optoelectronic memristor device as disclosed herein with electrodes composed of La doped BaSnO3 (Lanthanum doped Barium thin Oxide), an oxide layer composed of $PrCeO_2$, operating at a temperature of about 50° C. FIG. 8A illustrates how there is no shift in the voltage peak when a white light pulse is applied in conjunction with an electrical pulse. On the other hand, as illustrated in FIG. 8B, when a UV light pulse is employed instead, a lower voltage peak is observed relative to no illumination. FIG. 8C shows additional detail on how the voltage peaks shift based on the intensity of the UV light pulse.

Figure 9B:
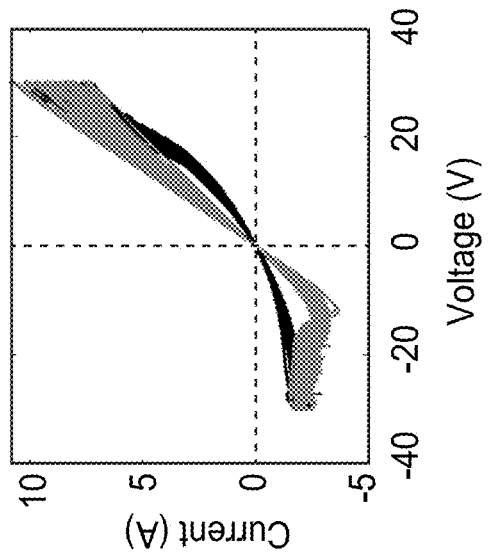
FIG. 9B is a plot illustrating the volatile, non-retentive behavior exhibited by the memristor device of FIG. 9A.
Figure 9A:
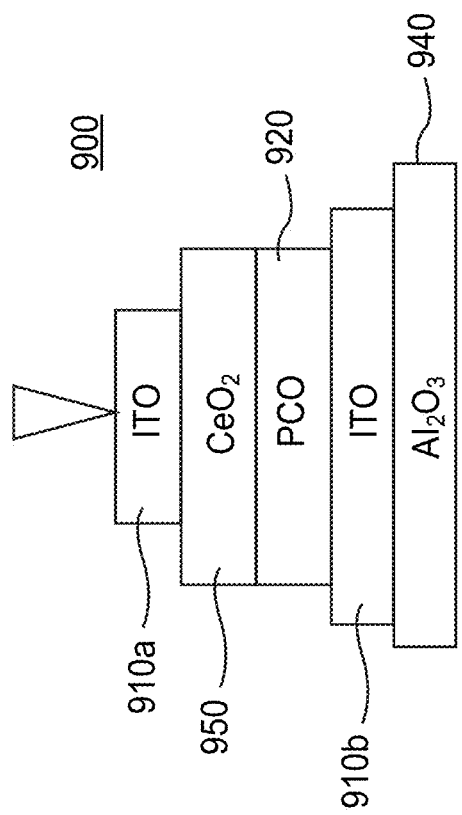
FIG. 9A is a schematic of various layers of another example memristor device having an additional layer of $CeO_2$ relative to the example memristor device of FIG. 5A.

FIG. 9A illustrates an optical memristor device 900, formed on a substrate 940 that includes a first electrode 910a, a second electrode 910b, and a first solid electrolyte layer 920, similar to the device 100. The device 900 also includes a second solid electrolyte layer 950 (also sometimes referred to as an exchange layer) between the first electrode 910a and the first layer 920. FIG. 9A illustrates, as example materials, that the electrodes 910a, 910b may be composed of ITO; the first layer 920 may be composed of $PrCeO_2$; and that the second layer 950 may be composed of $CeO_2$. However, any suitable materials can be employed for each layer. The second solid electrolyte 950, for example, can include at least one of $GdCeO_2$, $CeO_2$, $TiO_2$, $La_2CuO_4$, $TaO_x$, $HfO_x$, $Y_2BaCuO_4$, or $SrTiO_3$. The second solid electrolyte 950 can also be doped, such as with, for example, Gd, Sm, or Yb.

Accordingly, the device 900 includes a first solid electrolyte 920 and a second solid electrolyte 950 disposed between the first solid electrolyte 920 and the second electrode 910b. The second solid electrolyte 950 can be different (e.g., have a different composition) from the first solid electrolyte. The electronic conductivity of the second solid electrolyte 950 can be greater than the electronic conductivity of the first solid electrolyte 920 at room temperature. During typical operation of such a device, the spatial redistribution of ionic defects (described above for device 100) may further include a migration of the ionic defects between the first solid electrolyte 920 and the second solid electrolyte 950. This migration contributes to the change in resistance of the first solid electrolyte 920 as well as to the change in the optical property of the first solid electrolyte 920 at the first wavelength.

Similar to, and as described for, the device 200, space charge zones can be formed between not only between each electrode and its adjacent layer (e.g., between electrode 910a and the second solid electrolyte 950, and between the electrode 910b and the first solid electrolyte 920), but also between the first solid electrolyte 920 and the second solid electrolyte 950. The exchange of oxygen (e.g., oxygen defects, oxygen interstitials, etc.) between these two layers modifies the space charge potential, and in turn modifies the resistance of the device 900. The exchange of oxygen increases retention, which in turn affects retention of the resistance change.

Additionally, with the first solid electrolyte 920 having a mixed valent dopant, it exhibits a characteristic absorbance peak, such that it has color. The second electrolyte 950, being without a mixed valent dopant, remains transparent at the first wavelength. When the oxygen content in the first solid electrolyte 920 is modified (as explained in greater detail for FIG. 10), this in turn modifies the oxidation state of the cation dopant, and modifies its color. When the electrical bias is reversed, the color modification is reversed.

FIG. 9B illustrates the voltage-current characteristics for the device 900 in FIG. 9A, and illustrates how, compared to the device 500 and its corresponding plot in FIG. 5B, the addition of the second layer 920 imparts non-volatile behavior to the device 900. Said another way, the spatial distribution of the ionic defects between the first solid electrolyte 920 and the second solid electrolyte 950 is maintained upon removal of the electric field/bias. This permits its use in a range of optoelectronic applications where non-volatile operation is desired or required.

Accordingly, aspects disclosed herein can encompass a method that includes applying an electric field pulse and an optical pulse to a solid electrolyte (e.g., the solid electrolyte 520, or the second solid electrolyte 950). The electric field pulse and the optical pulse can overlap in time as illustrated in FIGS. 4A-4B to induce a spatial redistribution of ionic defects in the solid electrolyte. The spatial redistribution can cause a change in an optical property and a change in an electrical property of the solid electrolyte. The method can also include sensing the change in the optical property and the change in the electrical property of the solid electrolyte. A width of the electric field pulse can be selected based on a temporal overlap between the optical pulse and the electrical field pulse. As shown in plot 460 in FIG. 4B, an amplitude of the electric field pulse can be selected based on a temporal overlap between the optical pulse and the electrical field pulse.

Aspects disclosed herein can also encompass a method that includes applying an optical pulse to a solid electrolyte (e.g., the solid electrolyte 520, or the second solid electrolyte 950). After applying the optical pulse to the solid electrolyte, an electric field pulse is applied to induce a spatial redistribution of ionic defects in the solid electrolyte. The spatial redistribution causes a change in an optical property and a change in an electrical property of the solid electrolyte. The method can further include sensing the change in the optical property and the change in the electrical property of the solid electrolyte. The amplitude, duration, or both of the optical pulse can be varied during application. Similarly, the amplitude, duration, or both of the electric field pulse can be varied during application.

Figure 10:
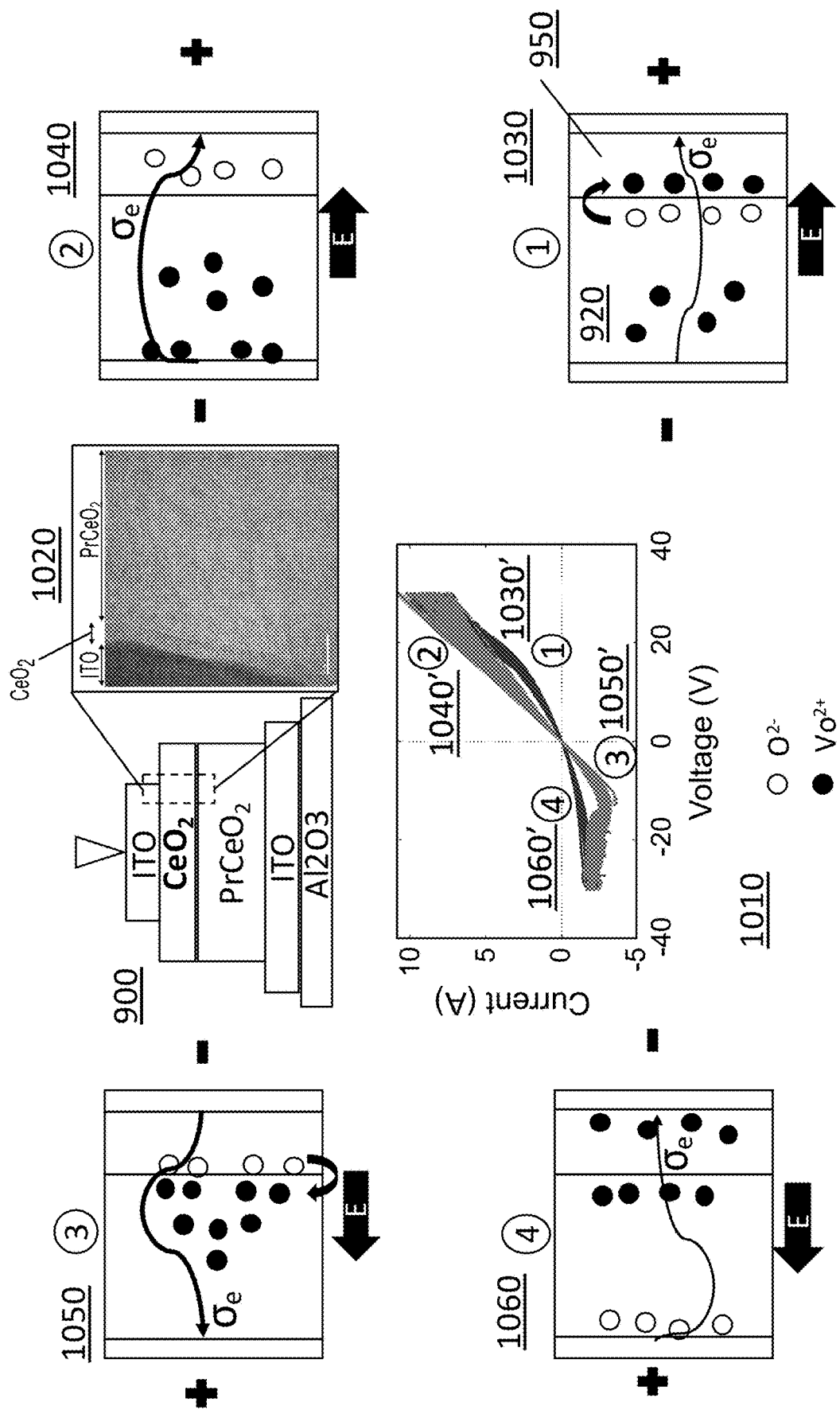
FIG. 10 is an illustration that maps curves of the plot of FIG. 9B to ionic movement in the memristor device of FIG. 9A.

FIG. 10 illustrates operation of the device 900 with respect to different stages of the current-voltage plot of FIG. 9B (reproduced here as plot 1010). FIG. 10 also shows a cross sectional view 1020 of the $ITO-CeO_2—PrCeO_2$ assembly of the device 900 (i.e., the first electrode-second solid electrolyte-first solid electrolyte) to show the relative sizes/thicknesses of the layers. As shown in the view 1020, the first solid electrolyte 920 can be thicker than the second solid electrolyte 950. The second solid electrolyte 950 can have a thickness of about 2 nm to about 15 nm, including all values and sub-ranges in between.

Panel 1030 (corresponding to portion 1030' of the plot 1010) illustrates how, upon application of forward bias in the dark (i.e., without optical stimulus), mobile oxygen ions and vacancies redistribute in each layer before being exchanged between the first layer 920 and the second layer 950, which in turn modifies the electrical resistance of the device 900. Specifically, mobile oxygen ions move from the first layer 920 to the second layer 950, while the vacancies from both layers accumulate in the first layer 920, as best illustrated in subsequent panel 1040. During this movement, vacancies in the second layer 950 are filled while vacancies in the first layer 920 are created. Panel 1040 (corresponding to portion 1040' of the plot 1010) illustrates how after the exchange process, the ionic species are distributed differently within the layers 920, 950, resulting in the layer 950 being oxidized while the layer 920 is reduced, and resulting in a change in electrical resistance. Upon reversal of the electric field (i.e., from forward bias to reverse bias) this resistance is initially retained even though the ionic defects rearrange within the individual layers, until the ionic defects are again exchanged between the layers 920, 950 as depicted in Panel 1050 (corresponding to portion 1050' of the plot 1010). Panel 1050 shows how, when the electrical bias are reversed, the mobile oxygen ions and the vacancies are again exchanged between the layers 920, 950, resulting in the state shown in panel 1060. Panel 1060 (corresponding to portion 1060' of the plot 1010) shows how application of a reset pulse can cause the distribution of the charged species to revert to the state of plot 1030.

Figure 11B:
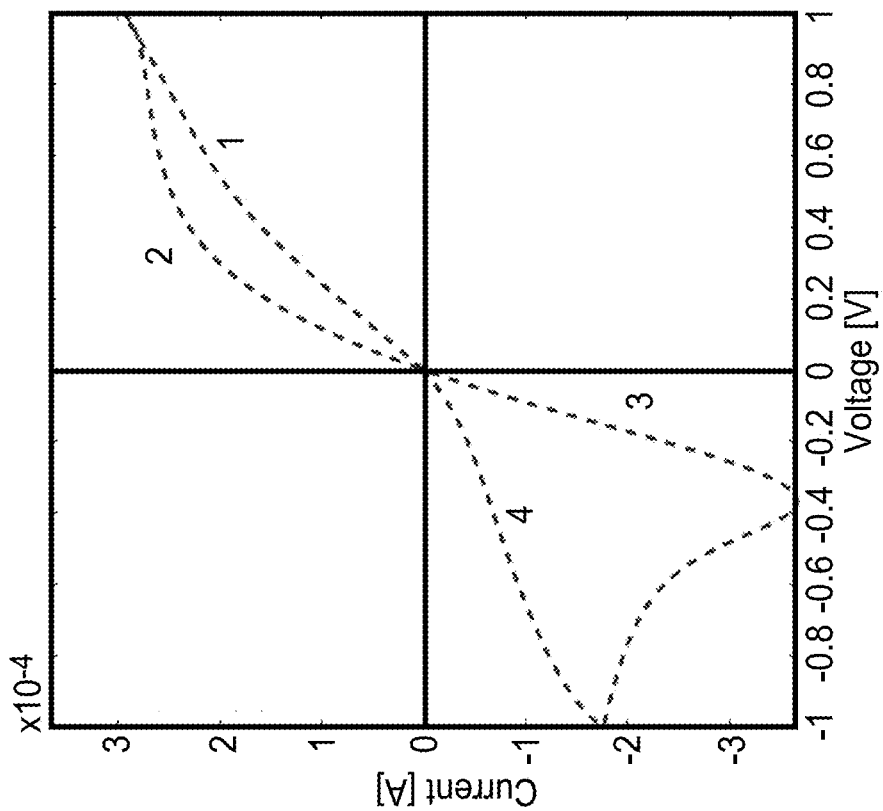
FIG. 11B is a plot of simulated current-voltage characteristics obtained by simulating increased oxygen leakage towards one electrode in the memristor device of FIG. 5A.
Figure 11A:
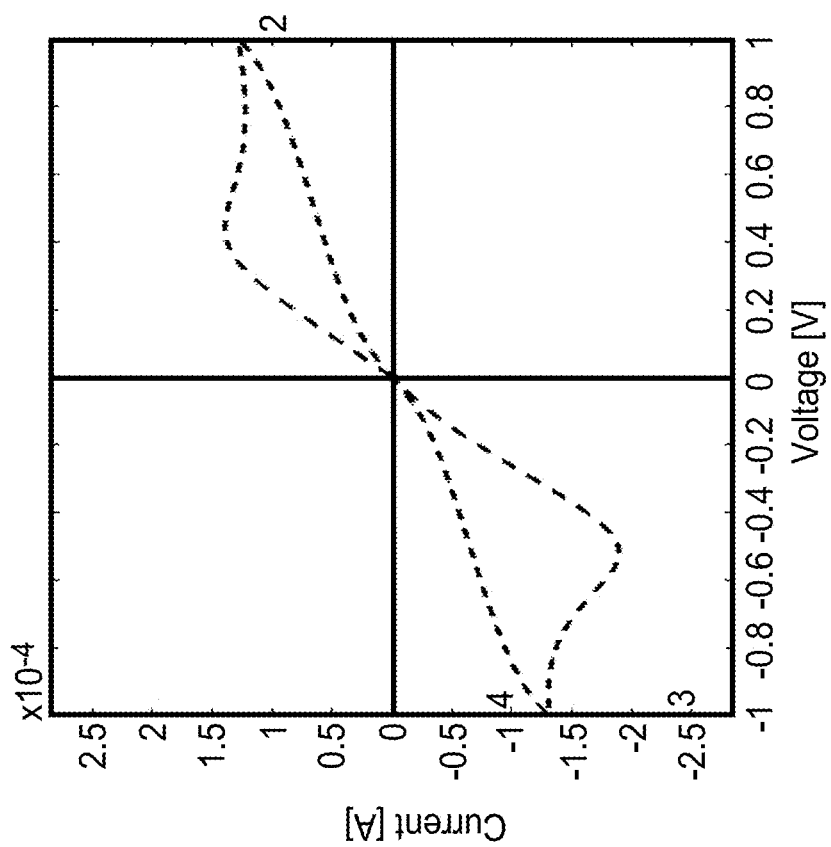
FIG. 11A is a plot of simulated current-voltage characteristics of the example memristor device of FIG. 5A.
Figure 11C:
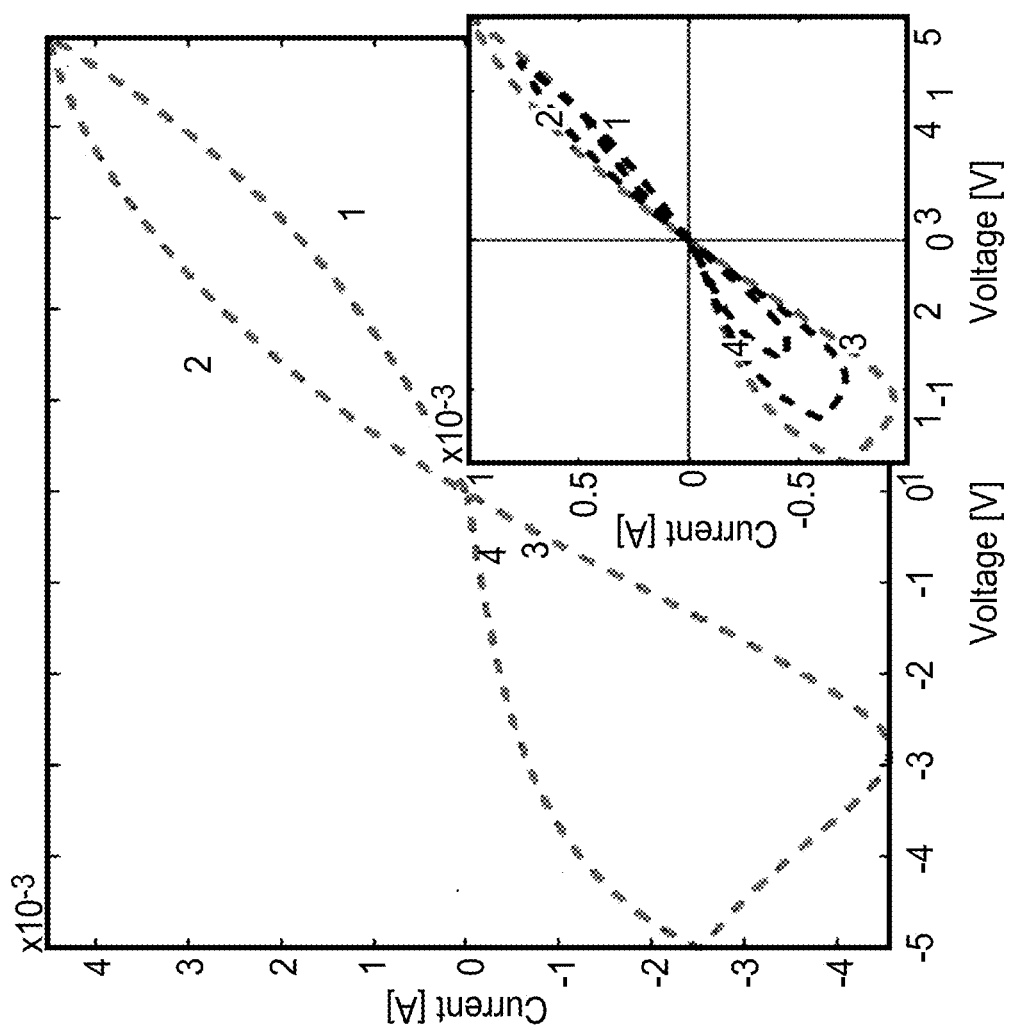
FIG. 11C is a plot of simulated current-voltage characteristics obtained by subsequently increasing the voltage applied to the memristor device of FIG. 5A. The inset plot in FIG. 11C shows current-voltage characteristics for different voltage ranges, and illustrates how current-voltage hysteresis increases with increasing voltage.

FIGS. 11A-1C are plots of simulations illustrating, and validating, how such oxygen 'leakage' from one layer (the first layer 920) to another (the layer 950) explains the difference in the current-voltage characteristics between the devices 500, 900. FIG. 11A is a plot of simulated current-voltage characteristics of the device 500. This plot shows a symmetric system, i.e., one with the same response profile no matter the direction of the bias, due to no oxygen leakage. This plot compares well to the plot of FIG. 5B for the device 500. FIG. 11B illustrates how oxygen leakage on one side of the oxide (e.g., by adding a second oxide layer, as illustrated in FIG. 9A for the device 900) creates an asymmetry in the response. FIG. 11C illustrates how the simulate curve changes with increase in the voltage of the applied electrical bias. This corresponds well with the plot of FIG. 9B for the device 900.

FIG. 12 illustrates an environment/system 1200 within with a crossbar switch 1205 can operate. The crossbar switch 1205 includes two layers 1210a, 1201b of metallic electrodes running in orthogonal directions with respect to each other, and with respect to other layers (not shown) situated above and below. Solid electrolyte material 1220 is positioned at each intersection of the electrode layers 1210a, 1201b, resulting in an electrode-solid electrolyte-electrode configuration 1230 (magnified to show detail) that can be similar to any of the devices 100, 200, 500. During operation, voltage pulses are applied to either or both of any two orthogonal metallic electrodes which overlap with a given solid electrolyte material. In either scenario, a net effective voltage will exist across the solid electrolyte material at the overlap of these electrodes, inducing a switching event as explained here. In this manner, the optical memristive devices effectively formed at each intersection/overlap can be simultaneously and independently operated. A suitable light source 1240 can be employed to read all the optical memristive devices in a given layer in a parallel fashion. By varying the focal point of the light source 1240, such as by using an optional lens 1250a, it becomes possible to read out different layers in the crossbar switch 1205. The output (shown here as collimated and/or otherwise spatially modulated by an optional lens 1250b) can include planar pixelated images 1260a-1260n, each image corresponding to a layer and each pixel corresponding to one of the solid electrolyte materials 1220, that can subsequently be interpreted by a computer (not shown).

In some aspects, a method includes applying a direct current (DC) electric field to a solid electrolyte (e.g., the first solid electrolyte 120, the first solid electrolyte 920, etc.). The solid electrolyte has an electrical conductivity of about $10^{-4}$ siemens/cm or less at room temperature (e.g., at around 25° C.). The electric field induces a spatial redistribution of ionic defects in the solid electrolyte, which in turn causes a change in an optical property of the solid electrolyte. Such a method can sometimes include illuminating the solid electrolyte (e.g., applying an optical signal/stimulus) so as to facilitate the spatial redistribution of ionic defects in the solid electrolyte. The method can further include (e.g., as described for the device 100) removing the electric field which in turn resetting the spatial redistribution of the ionic defects. In some cases, the device and/or the solid electrolyte can be maintained at a temperature of up to 500° C. during such application of the electric field.

As best illustrated in the device 900, the method can further encompass applying the DC field to the first solid electrolyte (e.g., the layer 920) and to a second solid electrolyte (e.g., the layer 950 disposed in electrical contact with the first solid electrolyte. The electrical conductivity of the second solid electrolyte can be greater than the electrical conductivity of the first solid electrolyte. The spatial redistribution in such methods can encompass a migration of ionic defects between the first solid electrolyte and the second solid electrolyte, which in turn contributes to the change in the optical property of the first solid electrolyte. The method can further include (e.g., as described for the device 900) removing the electric field while maintaining the spatial redistribution of the ionic defects.

Applications and Advantages of Optical Memristor Devices with Solid Electrolytes To emphasize benefits of the optical memristor devices disclosed herein, generally, integrated electronic-photonic devices are currently the focus of applications in data centers that managed 1.1 zettabytes of information transfer globally in 2016. The largest challenges to these data centers are related to the ability to keep up with global IP traffic all the while maintaining a reasonable power consumption. Technology relying on copper interconnects is not able to keep up due to the difficulties in scaling down device dimensions without compromising on energy costs. High-density 3D integrated electronic-photonic chips should enable the industry to keep up with global traffic demand as optical methods for transmitting data can reduce both power consumption and physical server size by over 75% over meter distances and at high bandwidth (e.g., >10 Gb/s). However, combining electronic and photonic components in a monolithic, CMOS compatible package still remains a primary challenge. One aspect to seamless integration of electronic and optical computing on a signal chip are non-volatile optoelectronic memories that bridge the gap between electronic and optical data transfer.

State of the art of non-volatile optical memory devices typically rely on phase change materials operating by application of current, which results in local heating leading to phase changes that are accompanied by optical property changes. However, the amount of power consumed per switch can be relatively high in phase change, non-volatile memory devices due to the desire for relatively high currents to locally heat the material. This leads to inherent drawbacks in device retention, given potential sensitivity to nearby temperature changes that can be impacted by the density of devices operating on chip. Engineering material properties of such devices can be challenging due to the desire to lower phase change temperatures thereby compromising on retention. There is, therefore, a trade-off between power consumption and retention in such devices. Moreover, current approaches of multi-bit information storage design is challenging due to structural relaxations of the amorphous phase, which is not the case for anionic memristive devices.

Accordingly, presented herein are optical memristive devices employing a material doping strategy based on mixed valent ion doping to simultaneously control the defect chemistry and mobility of defects controlling memristance, and introduce a tunable color change within the switching mechanism. By altering the material defect concentrations and interactions, as well as the nature of the dominant charged defect, performance enhancements can be achieved by the use of an external electromagnetic stimulus, such as light. Such devices can encompass operation as non-volatile optoelectronic memory devices in integrated circuits by simultaneously tuning the migration and optical properties of the oxide, as described in greater detail herein.

Optical memristive devices as described herein overcome selectivity issues in crossbar arrays, since an optical stimuli can serve as a non-contact third terminal (i.e, in addition to a anode and a cathode) providing the desired selectivity without increasing the complexity of the device circuit. Optical memristive devices as described herein also overcome the time-voltage issues since light can be used to modulate the switching barrier in a reversible fashion. This permits for fast switching under light stimulus followed by high retention in the dark. Generally, retention implies that the change in resistance and/or optical properties induced in the optical memristive device during an application of bias will relax relatively more slowly, or not at all. A reverse bias can be applied to the device to reverse the change.

Yet another benefit of optical memristive devices as described herein allow for, during electroforming, controlling the switching kinetics of the device using light. In this manner, it becomes possible to electroform the device at reduced voltages and current, thus improving device yield. With fast defect kinetics, electroforming will also be achievable on a smaller timescale, and with better control and uniformity. Accordingly, optical memristive devices as described herein are suitable for optoelectronic storage memory, such as in data servers, requiring high bandwidth, low latency, and efficient computation.

Disclosed herein are non-volatile, metal oxide-based memristor deices relying on ionic motion driven by high local electric fields, operating at reduced power consumption compared to conventional devices. While the change in optical properties is broad for phase change materials, with appropriate doping as disclosed herein, the optical properties of the oxide can be tuned in a controlled manner over a desirable wavelength range. With the limits of current electronic computational power within sight, moving towards integrated optoelectronic circuitry relies on the development of such non-volatile optoelectronic memory devices satisfying power consumption, bandwidth and retention requirements. Such memristive devices are candidates for such applications and offer unique opportunities compared to phase change materials due to the ease of material engineering and opportunities in neuromorphic computing.

The doping approaches disclosed herein and based on mixed valent cation can be used to control both material defects chemistry and optical properties, as well as the concept of using light as a non-contact third terminal. This is compatible with a wide range of metal oxide materials that exhibit memristive properties. The choice of oxide materials, based on their band gaps and memristive properties, as well as the choice of dopant, permits for selection of an optical transition over a wide range of wavelengths (e.g., from visible to telecom wavelengths). While the band gap of the host can define the largest possible optical transition, the choice of dopant can depend on its position within the band gap (shallow or deep trap), defining the optical transition of interest as well as the enthalpy of reduction (providing memristive enhancements). Dopants can include mixed valent cations for their ability to tune their oxidation state and provide optical greyscale. Elements from the lanthanide series such as Ce, Pr, Nd, Eu, Tb, Dy. and transition metal such as Fe, Ti, V, Cr, Mn, Co, Ni and Cu can be employed as dopants for the metal oxide/solid electrolytes disclosed herein. Hosts of interest can include binary and ternary oxides that exhibit memristive properties, such as dioxides $MO_2$ (e.g., $CeO_2$, $HfO_2$, $TiO_2$) and perovskites $ABO_3$ (e.g., $SrTiO_3$). Developing optical memristors as fast, non-volatile computing and storage memory devices may lead to other new exciting opportunities for developing fully integrated neural networks in data centers optimized for the treatment of video data.

While some demonstration of non-volatile optical memory based on memristive behavior has been recently demonstrated, little is understood about the exact mechanism(s) controlling the change in optical properties, or how to further engineer their performance. Such devices generally fall into three categories: electrochemical metallization based, anionic based, and organic-inorganic halide perovskite based. For electrochemical metallization based devices, where metallic ions from the electrode dissolve into the oxide and form conductive filaments, often the metals used are highly mobile ion such as Ag, Au or Cu, which are not CMOS compatible. Due to their extremely high mobilities, use of such ions warrants extra layers of complexity in the circuit design by adding diffusion barriers. In the case of organic-inorganic based memristor devices, these devices can exhibit poor long-term stability and, similar to solar cells, can undergo photo-degradation, making them inapplicable as optoelectronic memristor devices since they lack suitable retention and cyclability.

Some of the optical memristor devices discloses herein are anionic memristor devices where the optical attenuation can be controlled and/or enhanced, and the switching properties can be manipulated. The material properties of such devices can be engineered by doping the systems with optically tunable mixed valent cations. The dopants permit for altering the switching mechanism by facilitating the formation and migration of defects in the materials that presently dominate the switching process. The dopants also provide for tunable and specific optical properties that are correlated to the proximity of defects next to the dopant, which is directly manipulated during the switching process.

Such doping controls the switching process as well as the optical properties achieved in the optical memristor devices. Upon switching the device electrically, ion redistribution can lead to major changes in resistivity and to changes in the complex refractive index over the volume of the memristor. The pristine state of the oxide can be recovered by applying an opposite bias to redistribute the defects in the opposite direction. The choice of oxide material, its microstructure, as well as the initial stoichiometry of the oxide, can be controlled to achieve improved performance, such as larger complex refractive index changes and shorter response times.

Optical memristor devices as disclosed herein can be manufactured using existing processes/process lines for the development of memory technologies, while maintaining CMOS compatibility and low cost due to simple device architecture. Optical memristor devices as disclosed here can be integrated into photonic and electronic chips, where on-chip waveguides can provide the optical input to read bit states of juxtaposed memristive units that are connected electrically. Upon switching the memristive bit, the change in the complex refractive index over the volume of the memristive bit can alter the optical mode propagating down the waveguide and result in attenuation, and therefore transport of information (FIGS. 1A-1D). The use of light as a non-contact third terminal for anionic memristive switches can allow improvements in selectivity and switching speed.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An optoelectronic memristor comprising:
a first electrode transparent at a first wavelength;
a second electrode;
a solid electrolyte in electrical communication with the first electrode and the second electrode, the solid electrolyte having an electronic conductivity of about $10^{-10}$ Siemens/cm to about $10^{-4}$ Siemens/cm at room temperature; and
a direct current (DC) voltage source, in electrical communication with the first electrode and the second electrode, to apply an electric field across the solid electrolyte, the electric field inducing a spatial redistribution of ionic defects in the solid electrolyte, the spatial redistribution causing a change in resistance of the solid electrolyte and a change in an optical property of the solid electrolyte at the first wavelength,
wherein the change in the optical property of the solid electrolyte is a change in at least one of refractive index, absorption, or plasma frequency.

2. The optoelectronic memristor of claim 1, wherein the first wavelength is about 400 nm to about 800 nm.

3. The optoelectronic memristor of claim 1, wherein the first wavelength is about 600 nm to about 1000 nm.

4. The optoelectronic memristor of claim 1, wherein the first wavelength is about 1 micron to about 3 microns.

5. The optoelectronic memristor of claim 1, wherein the solid electrolyte has a thickness of about 5 nm to about 200 nm.

6. The optoelectronic memristor of claim 1, wherein the solid electrolyte comprises at least one of $CeO_2$, $SrTiO_3$, $Bi_2O_3$, $LaGaO_3$, $ThO_2$, $Hf_2O$, or $ZrO_2$.

7. The optoelectronic memristor of claim 1, wherein the change in resistance is about 100 ohms to about 100 Megaohms.

8. An optoelectronic memristor comprising:
a first electrode transparent at a first wavelength;
a second electrode;
a solid electrolyte in electrical communication with the first electrode and the second electrode, the solid electrolyte having an electronic conductivity of about $10^{-10}$ Siemens/cm to about $10^{-4}$ Siemens/cm at room temperature, wherein the solid electrolyte is doped with multi-valent cation dopants; and
a direct current (DC) voltage source, in electrical communication with the first electrode and the second electrode, to apply an electric field across the solid electrolyte, the electric field inducing a spatial redistribution of ionic defects in the solid electrolyte, the spatial redistribution causing a change in resistance of the solid electrolyte and a change in an optical property of the solid electrolyte at the first wavelength.

9. The optoelectronic memristor of claim 8, wherein the change in at least one optical property comprises a change in color of the solid electrolyte in response to compensation of the multi-valent cation dopants by the ionic defects.

10. The optoelectronic memristor of claim 8, wherein the multi-valent cation dopants comprise at least one of Fe, Ti, Pr, Cr, Co, Cu, Mn, Eu, Er, Dy, Nb, or Ni, and the ionic defects comprise at least one of oxygen vacancies or interstitial defects.

11. An optoelectronic memristor comprising:
a first electrode transparent at a first wavelength;
a second electrode;
a solid electrolyte in electrical communication with the first electrode and the second electrode, the solid electrolyte having an electronic conductivity of about $10^{-10}$ Siemens/cm to about $10^{-4}$ Siemens/cm at room temperature;
a direct current (DC) voltage source, in electrical communication with the first electrode and the second electrode, to apply an electric field across the solid electrolyte, the electric field inducing a spatial redistribution of ionic defects in the solid electrolyte, the spatial redistribution causing a change in resistance of the solid electrolyte and a change in an optical property of the solid electrolyte at the first wavelength; and
a light source, in optical communication with the solid electrolyte, to illuminate the solid electrolyte with light at a second wavelength different than the first wavelength, the light at the second wavelength promoting the spatial redistribution of ionic defects in the solid electrolyte.

12. The optoelectronic memristor of claim 11, further comprising:
a lens, in optical communication with the light source and the solid electrolyte, to collimate the light at the second wavelength.

13. An optoelectronic memristor comprising:
a first electrode transparent at a first wavelength;
a second electrode;
a solid electrolyte in electrical communication with the first electrode and the second electrode, the solid electrolyte having an electronic conductivity of about $10^{-10}$ Siemens/cm to about $10^{-4}$ Siemens/cm at room temperature;
a direct current (DC) voltage source, in electrical communication with the first electrode and the second electrode, to apply an electric field across the solid electrolyte, the electric field inducing a spatial redistribution of ionic defects in the solid electrolyte, the spatial redistribution causing a change in resistance of the solid electrolyte and a change in an optical property of the solid electrolyte at the first wavelength; and
a photodetector, in optical communication with the solid electrolyte via the first electrode, to detect the change in the optical property of the solid electrolyte at the first wavelength.

14. An optoelectronic memristor comprising:
a first electrode transparent at a first wavelength;
a second electrode transparent at the first wavelength;
a solid electrolyte in electrical communication with the first electrode and the second electrode, the solid electrolyte having an electronic conductivity of about $10^{-10}$ Siemens/cm to about $10^{-4}$ Siemens/cm at room temperature;
a direct current (DC) voltage source, in electrical communication with the first electrode and the second electrode, to apply an electric field across the solid electrolyte, the electric field inducing a spatial redistribution of ionic defects in the solid electrolyte, the spatial redistribution causing a change in resistance of the solid electrolyte and a change in an optical property of the solid electrolyte at the first wavelength; and
a photodetector, in optical communication with the solid electrolyte via the second electrode, to detect the change in the optical property of the solid electrolyte at the first wavelength.

15. An optoelectronic memristor comprising:
a first electrode transparent at a first wavelength;

a second electrode;
a solid electrolyte in electrical communication with the first electrode and the second electrode, the solid electrolyte having an electronic conductivity of about $10^{-10}$ Siemens/cm to about $10^{-4}$ Siemens/cm at room temperature; and
a direct current (DC) voltage source, in electrical communication with the first electrode and the second electrode, to apply an electric field across the solid electrolyte, the electric field inducing a spatial redistribution of ionic defects in the solid electrolyte, the spatial redistribution causing a change in resistance of the solid electrolyte and a change in an optical property of the solid electrolyte at the first wavelength,
wherein the spatial redistribution of the ionic defects is reset upon removal of the electric field.

16. An optoelectronic memristor comprising:
a first electrode transparent at a first wavelength;
a second electrode;
a first solid electrolyte in electrical communication with the first electrode and the second electrode, the solid electrolyte having an electronic conductivity of about $10^{-10}$ Siemens/cm to about $10^{-4}$ Siemens/cm at room temperature;
a second solid electrolyte in electrical communication with the first solid electrolyte and the second electrode, the second solid electrolyte being different from the first solid electrolyte, an electronic conductivity of the second solid electrolyte being greater than an electronic conductivity of the first solid electrolyte at room temperature; and
a direct current (DC) voltage source, in electrical communication with the first electrode and the second electrode, to apply an electric field across the first solid electrolyte and the second solid electrolyte, the electric field inducing a spatial redistribution of ionic defects in the first solid electrolyte, the spatial redistribution causing a change in resistance of the first solid electrolyte and a change in an optical property of the first solid electrolyte at the first wavelength,
wherein the spatial redistribution comprises a migration of the ionic defects between the first solid electrolyte and the second solid electrolyte, the migration contributing to the change in resistance of the first solid electrolyte and the change in the optical property of the first solid electrolyte at the first wavelength.

17. The optoelectronic memristor of claim 16, wherein the spatial distribution of the ionic defects between the first solid electrolyte and the second solid electrolyte is maintained upon removal of the electric field.

18. The optoelectronic memristor of claim 16, wherein the thickness of the first solid electrolyte is greater than the thickness of the second solid electrolyte.

19. The optoelectronic memristor of claim 16, wherein the first solid electrolyte has a thickness of about 5 nm to about 200 nm.

20. The optoelectronic memristor of claim 19, wherein the thickness of the first solid electrolyte is greater than the thickness of the second solid electrolyte.

21. The optoelectronic memristor of claim 16, wherein the second solid electrolyte has a thickness of about 2 nm to about 15 nm.

22. The optoelectronic memristor of claim 16, wherein the second solid electrolyte comprises at least one of $CeO_2$, $TiO_2$, $La_2CuO_4$, $TaO_x$, $HfO_x$, $Y_2BaCuO_4$, $SrTiO_3$.

23. The optoelectronic memristor of claim 16, wherein the first solid electrolyte comprises $PrCeO_2$ and the second solid electrolyte comprises $CeO_2$.

24. The optoelectronic memristor of claim 16, wherein the second solid electrolyte is doped with Gd, Sm, or Yb.

25. A method, comprising:
applying a direct current (DC) electric field to a solid electrolyte, the solid electrolyte having an electrical conductivity of about $10^{-4}$ siemens/cm or less at room temperature, the electric field inducing a spatial redistribution of ionic defects in the solid electrolyte, the spatial redistribution causing a change in an optical property of the solid electrolyte;
sensing the change in the optical property of the solid electrolyte;
removing the electric field; and
resetting the spatial redistribution of the ionic defects after removing the electric field.

26. The method of claim 25, further comprising:
illuminating the solid electrolyte so as to facilitate the spatial redistribution of ionic defects in the solid electrolyte.

27. The method of claim 25, further comprising maintaining the solid electrolyte at a temperature up to 500° C. during said applying and sensing.

28. A method, comprising:
applying a direct current (DC) field to a first solid electrolyte and to a second solid electrolyte in electrical communication with the first solid electrolyte, the first solid electrolyte having an electrical conductivity of about $10^{-4}$ siemens/cm or less at room temperature, an electrical conductivity of the second solid electrolyte being different than the electrical conductivity of the first solid electrolyte, the electric field inducing a spatial redistribution of ionic defects in the first solid electrolyte and the second solid electrolyte, the spatial redistribution causing a change in an optical property of the first solid electrolyte, the spatial redistribution comprising a migration of ionic defects between the first solid electrolyte and the second solid electrolyte, the migration contributing to the change in the optical property of the first solid electrolyte; and
sensing the change in the optical property of the first solid electrolyte.

29. The method of claim 28, further comprising:
removing the electric field; and
maintaining the spatial redistribution of the ionic defects between the first solid electrolyte and the second solid electrolyte after removing the electric field.

* * * * *